United States Patent [19]

Ikeda et al.

[11] Patent Number: 5,320,703

[45] Date of Patent: Jun. 14, 1994

[54] PROCESS FOR FORMING GOLD CRYSTAL FILM

[75] Inventors: Tsutomu Ikeda, Hachioji; Hideo Kato, Yokohama; Masahiko Miyamoto, Tokyo; Ken Eguchi, Yokohama; Taichi Sugimoto, Sagamihara; Haruki Kawada, Yokohama; Kiyoshi Takimoto, Isehara; Toshihiko Takeda, Atsugi, all of Japan

[73] Assignee: Canon Kabushiki Kaisha, Tokyo, Japan

[21] Appl. No.: 880,233

[22] Filed: May 8, 1992

[30] Foreign Application Priority Data

| May 9, 1991 | [JP] | Japan | 3-132176 |
| Jul. 31, 1991 | [JP] | Japan | 3-213054 |
| Jul. 31, 1991 | [JP] | Japan | 3-213055 |
| Oct. 1, 1991 | [JP] | Japan | 3-278890 |
| Nov. 25, 1991 | [JP] | Japan | 3-309238 |
| Nov. 26, 1991 | [JP] | Japan | 3-310829 |
| Nov. 27, 1991 | [JP] | Japan | 3-312546 |
| May 8, 1992 | [JP] | Japan | 4-116171 |

[51] Int. Cl.$^5$ .............................. C30B 29/02
[52] U.S. Cl. .......................... 117/68; 117/70; 117/928

[58] Field of Search ....... 156/600, 621, 624, DIG. 85; 23/295 R

[56] References Cited

U.S. PATENT DOCUMENTS 5,041,195  8/1991  Taylor et al. ............... 204/98

FOREIGN PATENT DOCUMENTS 55-54509   4/1980  Japan .
56-38406   4/1981  Japan .
5554509   12/1982  Japan .
63-5272    2/1988  Japan .

OTHER PUBLICATIONS

Trevor, et al. "In Situ Scanning-Tunneling-Microscope Observation of Roughening, Annealing, and Dissolution of Gold (111) in an Electrochemical Cell," Physical Review Letters, vol. 62, No. 8, pp. 929–932, (Feb. 20, 1989).

*Primary Examiner*—Robert Kunemund
*Attorney, Agent, or Firm*—Fitzpatrick, Cella, Harper & Scinto

[57] ABSTRACT

A process for forming a gold thin film comprises subjecting a gold complex to a decomposition treatment to transfer the gold in a solution to a supersaturated state, and forming a crystalline gold thin film composed of a group of monocrystals on the surface of a substrate.

52 Claims, 9 Drawing Sheets

PROCESS FOR FORMING GOLD CRYSTAL FILM

BACKGROUND OF THE INVENTION

1. Field of the Invention

The present invention relates to a process for forming a gold crystal film, and more particularly to a process for forming a gold crystal thin film suitable for the production of electronic devices, optical devices, piezoelectric devices, etc. of semiconductor integrated circuits, optical integrated circuits, magnetic circuits, etc., or electron-emitting devices, electrodes for recording media, etc.

2. Related Background Art

Heretofore, gold thin films have been widely used in decoration of accessories such as watchbands, etc., wires or electrodes in the thick film field such as lead frames, HIC, etc., or thin film wires for GaAs semiconductors. Recently electromigration of Al wires has been a serious problem due to requirements for higher density of Si semiconductor devices. Thus, gold as a heavy metal has been regarded as a promising wire material. Particularly a gold crystal thin film comprising a group of monocrystals of large grain sizes, which has excellent anti-electromigration and anti-corrosion, a low resistance, a good anti-melting, etc. has been in demand.

From this background attempts have been made to develop processes for forming a gold crystal film. A vacuum vapor deposition process, a CVD process, an electrolytic plating process, and an electroless plating process are known as processes for forming a gold crystal thin film on a substrate.

The vacuum vapor deposition process comprises heating a substrate of Si, SiO$_2$, SiN, GaAs, sapphire, Cr, Ti, or Cu to a temperature of 500° to 700° C. by electron beam or resistance heating, and then introducing gold in a vapor phase thereto under vacuum, usually, of not more than 10$^{-6}$ Torr, thereby depositing the gold onto the substrate. It is reported that monocrystals of gold having such large grain sizes as a few 10 μm can be formed on mica by the vacuum vapor deposition process (Dennis J. Trevor et al: Physical Review Letters, Vol. 162, No. 8, Feb. 20, 1989).

It is also reported that a gold polycrystalline thin film can be formed on Si by a hot CVD process and a PECVD process (N. Misawa et al: No. 37 Symposium on Semiconductor-Integrated Circuit Technology, Dec. 7, 1989).

The electrolytic plating process and the electroless plating process are old processes utilized in formation of decorating gold thin films or plating of lead frames and comprise forming a layer of gold, copper or nickel on the surface of a substrate in advance, and then forming a gold thin film thereon.

Furthermore, a technique of depositing gold powder for an electroconductive gold paste in a suspended state in a system by utilizing a gold supersaturation phenomenon in the solution due to decomposition of gold complexes is disclosed in Japanese Patent Applications Kokai (Laid-open) Nos. 56-38406 and 55-54509.

According to the vacuum vapor deposition process and the CVD process, a gold crystal thin film composed of a group of monocrystals having large grain sizes can be formed on an inert substrate of mica or highly oriented graphite, but only a gold thin film composed of a group of monocrystals having submicron grain sizes or a gold polycrystalline film is formed on a semiconductor material of Si or GaAs or on ceramics of SiO$_2$, SiN or Al$_2$O$_3$.

Furthermore, the vacuum vapor deposition process and the CVD process require an elevated substrate temperature and thus devices incapable of being disposed at an elevated temperature suffer from many restrictions. For example, in case of forming a gold thin film on Si, an Au—Si alloy is formed by melting and thus the substrate temperature can never be more than the eutectic temperature of 363° C.

According to the electrolytic plating process and the electroless plating process only a polycrystalline film is obtained. Further, no monocrystalline film is obtained, and it is necessary to form a device on the electroconductive surface of gold, copper or nickel.

The processes disclosed in the above-mentioned Japanese Patent Applications Kokai (Laid-open) Nos. 56-38406 and 55-54509 are directed only to formation of gold in a powdery state and nowhere teach or suggest formation of gold in a film state on a desired substrate.

Thus, the technique of forming a gold crystal film including monocrystals, which is applicable to electronic devices, optical devices, etc., on a substrate at a low temperature has room for further improvement.

SUMMARY OF THE INVENTION

An object of the present invention is to overcome the technical problems of the prior art and provide a process for forming gold crystals in a film state on a substrate at a low temperature.

Another object of the present invention is to provide a process for forming gold crystals, which can form a gold crystal thin film composed of a group of monocrystals of large grain sizes excelling in anti-electromigration, anti-corrosion, and anti-melting properties and exhibiting low resistance on a substrate of ceramics or semiconductor under atmospheric pressure at a low temperature close to the ambient temperature without using any special apparatus.

Other object of the present invention is to provide a process for selectively forming a gold crystal film in view of differences in materials or compositions that constitute a substrate surface.

DESCRIPTION OF THE PREFERRED EMBODIMENT

Figure 1A:
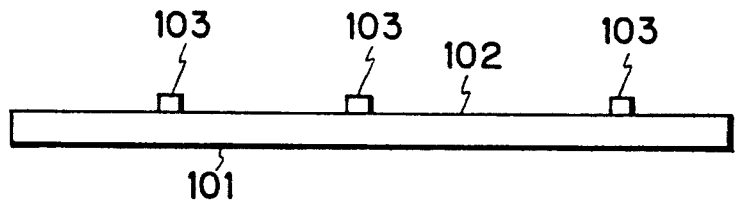
FIGS. 1A to 1D are schematic views each showing one embodiment of a process for forming a gold crystal film according to the present invention.

It is a first aspect of the present invention to provide a process for forming a gold crystal thin film, which comprises subjecting a gold complex to a decomposition treatment to transfer the gold in a solution to a supersaturated state and forming a crystalline gold thin film composed of a group of monocrystals on the surface of a substrate.

It is a second aspect of the present invention to provide a process for forming a crystalline gold thin film, which comprises subjecting a gold complex in a gold complex solution to a decomposition treatment to transfer the gold in the solution to a supersaturated state, and forming a crystalline gold thin film composed of a group of monocrystals only on a first surface composed of a material having a larger nucleation density of a substrate having the first surface and a second surface composed of a material having a smaller nucleation density, the first surface and the second surface being provided adjacent to each other.

It is a third aspect of the present invention to provide a process for forming a crystalline gold thin film, which comprises subjecting a gold complex in a gold complex solution to a decomposition treatment to transfer the gold in the solution to a supersaturated state, and making the monocrystal grow only from a single nucleus formed on a first surface composed of a material having a larger nucleation density and having a sufficiently small area so as to form only the single nucleus of a substrate having the first surface and a second surface composed of a material having a smaller nucleation density, the first surface and the second surface being provided adjacent to each other.

It is a fourth aspect of the present invention to provide a process for forming a crystalline gold thin film, which comprises subjecting a gold complex to a decomposition treatment in the presence of an etching species acting on a substrate material to transfer the gold in a solution to a supersaturated state, and forming a crystalline gold thin film composed of a group of monocrystals on the surface of the substrate.

It is a fifth aspect of the present invention to provide a process for forming a crystalline gold thin film, which comprises a step of providing a substrate having a first surface composed of a material having a larger nucleation density and a second surface composed of a material having a smaller nucleation density, the first surface and the second surface being adjacent to each other, and a step of subjecting a gold complex in a gold complex solution to a decomposition treatment in the presence of an etching species acting on the material having a smaller nucleation density to transfer the gold in the solution to a supersaturated state, and forming a crystalline gold thin film composed of a group of monocrystals only on the surface having a greater nucleation density.

It is a sixth aspect of the present invention to provide a process for forming a gold monocrystal, which comprises a step of providing a substrate having a first surface composed of a material having a larger nucleation density and having a sufficiently small area so as to form only a single nucleus and a second surface composed of a material having a smaller nucleation density, the first surface and the second surface being adjacent to each other, and a step of subjecting a gold complex in a gold complex solution to a decomposition treatment in the presence of an etching species acting on the material having a smaller nucleation density to transfer the gold in the solution to a supersaturated state, and making the monocrystal grow from the single nucleus on the first surface having a larger nucleation density.

According to the present invention, a gold crystal thin film can be formed at atmospheric pressure and a temperature close to the ordinary temperature without using any special apparatus by subjecting a gold complex to a decomposition treatment, thereby transferring the gold in a solution to a supersaturated state. Furthermore, gold crystal can be selectively formed on a substrate, and a gold crystal thin film composed of monocrystals and having a very smooth surface can be obtained by selecting an appropriate solution species for the growth system.

Grain size of crystals can be controlled by selecting the species of substrate surface materials and gold complexes or by controlling the concentration of the etching species acting on the substrate materials.

The gold crystal thin film obtained according to the present invention is characterized by control to the (111) orientation. Thus, even in case of monocrystals having large grain sizes due to a very high growth rate in the lateral direction, a thin film can be formed. In case of lamination of a piezoelectric film on a gold crystal thin film, a successive (111) orientation can be maintained.

The gold crystal thin film obtained according to the present invention contains monocrystals of large grain sizes, which are excellent in anti-electromigration, anti-corrosion, and anti-melting properties and low in resistance and thus can be utilized in electronic devices, optical devices and piezoelectric devices of semiconductor integrated circuits, optical integrated circuits and magnetic circuits or as electron-emitting devices and electrodes for recording media.

Embodiments of the present invention will be explained in detail below, referring to the drawings.

Embodiment 1-1

Explanation will be made below, referring to FIGS. 1A to 1D, where gold crystals are formed on a SiO$_2$ substrate 101 from a gold complex [AuI$_4$]$^-$ by an evaporation treatment as a means for a decomposition treatment.

At first, potassium iodide and iodine are put into distilled water to form an aqueous iodine solution, and then gold is put into the resulting solution to form a gold complex solution containing [AuI$_4$]$^-$. It seems that the resulting solution contains I$_3^-$ and K$^+$ besides the gold complex [AuI$_4$]$^-$.

An aqueous iodine solution can be also prepared by dissolution of other iodide compounds than potassium iodide, for example, ammonium iodide. An alcoholic iodine solution in alcohol as a solvent or an aqueous alcoholic iodine solution in a solvent mixture of alcohol and water can be also used in the present invention. An amount of dissolved gold depends on a concentration of iodine and iodide compound in the solution.

Then, the surface 102 of the SiO$_2$ substrate 101 is brought in contact with the solution, and then the solution is heated to 30°-100° C. to promote evaporation of iodine component. In the solution, it seems that decomposition proceeds due to the evaporation of iodine components existing in an $I_3{}^-$ state and the consequent dissociation of I components from $[AuI_4]^-$ to maintain the equilibrium state of the solution or due to the direct evaporation of iodine components existing in the form of $[AuI_4]^-$ in the complex, and as a result the gold is brought into a supersaturated state.

The gold in the supersaturated state in the solution deposits as random nuclei 103 on the substrate surface (FIG. 1A). It is characteristic of the present process that nuclei grow self-conformably while being kept at a low nucleation density.

The nucleation density depends on the species of substrate surface materials and complexes and growth conditions, and particularly strongly on the substrate surface materials.

Figure 1B:
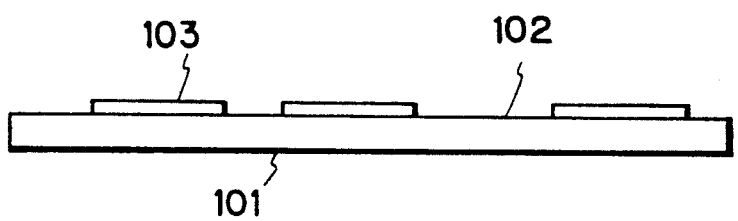

About 3 minutes from the start of growth, crystals 103 grow to grain sizes of about 30 μm (FIG. 1B). A result of analysis reveals that the thus formed crystals are defect-free monocrystals with the (111) orientation. A result of observation of growth rate reveals that the growth is made in a ratio of growth rate in the longitudinal direction to that in the lateral direction of 1:100–200.

Figure 1C:
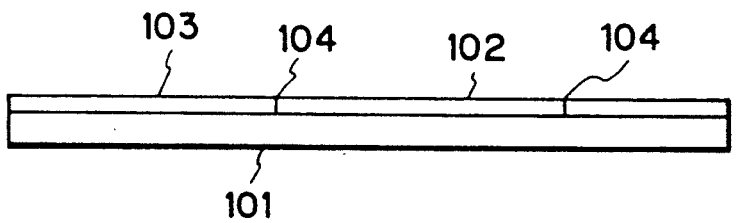
Figure 1D:
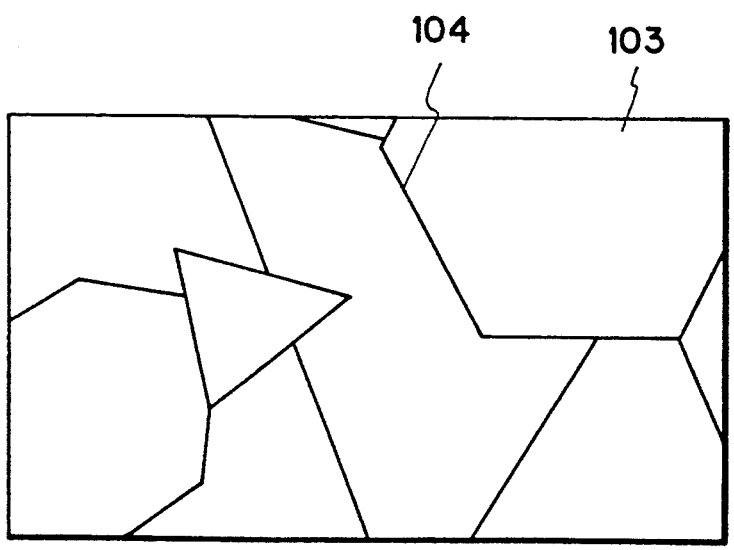

With continued growth, the crystals themselves contact one another, as shown in FIGS. 1C and 1D to form grain boundaries 104 and cover the entire substrate surface. Thus, a crystalline gold thin film composed of a group of monocrystals having an average particle size of about 500 μm can be formed.

This embodiment is effective for forming gold monocrystals having very smooth surfaces, because it seems that the iodine existing in the solution suppresses further nucleation on the gold crystals at the growth stage due to its gold-dissolving action.

The crystalline gold thin film prepared in this embodiment can be utilized as a thin film wire composed of a group of gold monocrystals by wet etching or dry etching, using a resist.

Embodiment 1-2

An embodiment of forming gold crystals on a $SiO_2$ substrate 102 from gold complex $[AuI_4]^-$ by using a reducing agent as a means for a decomposition treatment is explained below.

A gold complex solution containing $[AuI_4]^-$ is prepared in the same manner as in Embodiment 1-1. Then, an aqueous solution of $Na_2SO_3$ as a reducing agent is slowly dropwise added to the gold complex solution, while keeping the solution at room temperature. It seems that decomposition proceeds in the solution due to ionization of iodine components existing in the $I_2$ state to $2I^-$ and the consequent dissociation of the iodine components from $[AuI_4]^-$ to maintain the equilibrium state in the solution, and as a result the gold is brought into a supersaturated state and nuclei 103 are formed at random on the substrate surface (FIG. 1A). It is characteristic of the present process that nuclei grow self-conformably while being kept at a low nucleation density.

The nucleation density depends on the species of substrate surface materials and complex and growth conditions, and particularly strongly on the substrate surface materials. In case of using a reducing agent as a means for a decomposition treatment as in this embodiment, if the concentration of the reducing agent is high, nuclei are formed in the solution and no crystals are formed on the substrate surface, or fine polycrystals are formed on the substrate surface.

About 3 minutes from the start of growth, crystals 103 grow to grain size of about 30 μm (FIG. 1B). The thus obtained crystals have similar crystal structure and shape to those of Embodiment 1-1.

With continued growth, the crystals themselves contact one another, as shown in FIGS. 1C and 1D to form grain boundaries 104 and cover the entire substrate surface. Thus, a crystalline gold thin film composed of a group of monocrystals having an average particle size of about 200 μm can be formed.

This embodiment is effective for forming gold monocrystals having very smooth surfaces, because it seems that the iodine existing in the solution suppresses further nucleation on the gold crystals at the growth stage due to its gold-dissolving action.

Embodiment 1-3

An embodiment of forming gold crystals on a Si substrate 101 from $[AuI_4]^-$ as a gold complex by an evaporation treatment as a means for a decomposition treatment is explained below.

A gold complex solution containing $[AuI_4]^-$ is prepared in the same manner as Embodiment 1—1. Then, the surface 102 of the Si substrate 101 is brought into contact with the solution, and then the solution is heated to a temperature of 30° to 100° C. to promote evaporation of the iodine components.

In the solution, decomposition proceeds due to the evaporation of iodine components existing in the $I_3{}^-$ state and the consequent dissociation of iodine components from $[AuI_4]^-$ to maintain the equilibrium state in the solution, or due to the direct evaporation of iodine components from the complexes existing in the form of $[AuI_4]^-$, and as a result the gold is brought into a supersaturated state and nuclei 103 are formed at random on the substrate surface (FIG. 1A).

About 3 minutes after the start of growth, crystals grow to grain size of about 10 μm as the largest (FIG. 1B). A result of analysis reveals that the thus formed crystals are defect-free monocrystals in triangular and hexangular shapes as dominant ones and with the (111) orientation. A result of observation of growth rate reveals that the growth is made in a ratio of growth rate in the longitudinal direction to that in the lateral direction of 1:100–200.

With continued growth, the crystal themselves contact one another, as shown in FIGS. 1C and 1D to form grain boundaries 104 and cover the entire substrate surface. Thus, a crystalline gold thin film composed of a group of monocrystals having an average grain size of about 25 μm can be formed.

this embodiment is effective for forming gold monocrystals having very smooth surfaces, because it seems that the iodine existing in the solution suppresses further nucleation on the gold crystals at the growth stage due to its gold-dissolving action.

Embodiment 1-4

Explanation will be made below of an embodiment of forming gold crystals on a Si substrate from $[AuCl_4]^-$ as a gold complex by adding a reducing agent as a means for a decomposition treatment.

At first, aqua regia is prepared by mixing hydrochloric acid and nitric acid in a ratio of the former to the latter of 3:1. Gold is put into the aqua regia and dissolved therein with stirring to form a gold complex solution containing $[AuCl_4]^-$, where is seems that the resulting solution contains $AuCl_3.NOCl$, $NOCl$ and $Cl_2$ besides the gold complex $[AuCl_4]^-$.

Then, an aqueous NaOH solution is slowly dropwise added thereto, while keeping the solution at room temperature. In the solution, decomposition proceeds due to decomposition of NOCl as an Au-dissolving substance by NaOH and/or direct decomposition of $[AuCl_4]^-$, and thus the gold is brought into a supersaturated state and nuclei 103 are formed at random on the substrate surface (FIG. 1A).

With continued growth the crystals themselves contact one another, as shown in FIGS. 1C and 1D to form grain boundaries 104 to cover the entire substrate surface, whereby a crystalline gold thin film composed of a group of monocrystals having an average grain size of about 4 μm can be formed.

This embodiment is effective for forming gold monocrystals having very smooth surfaces, because it seems that nitrosyl chloride existing in the solution suppresses further nucleation on the gold crystals at the growth stage due to its gold-dissolving action.

Embodiment 1-5

Explanation will be made of an embodiment of forming gold crystals on a Ti substrate from $[AuI_4]^-$ as a gold complex and an evaporation treatment as a means for a decomposition treatment.

At first, a gold complex solution containing $[AuI_4]^-$ is prepared in the same manner as in Embodiment 1, and then the surface 102 of a Ti substrate 101 is brought in contact with the resulting solution, and then the solution is heated to a temperature of 30°-100° C. to promote evaporation of iodine components.

It seems that in the solution decomposition proceeds due to the evaporation of the iodine components existing in the $I_3^-$ state and the consequent dissociation of iodine components from $[AuI_4]^-$ to maintain the equilibrium state of the solution or due to the direct evaporation of iodine components from the complex existing in the form of $[AuI_4]^-$. As a result, the gold is brought into a supersaturated state and nuclei 103 are formed at random on the substrate surface (FIG. 1A).

With continued growth, the crystals themselves contact one another, as shown in FIGS. 1C and 1D to form grain boundaries 104, whereby a crystalline gold thin film covers the entire substrate surface. Thus, a crystalline gold thin film composed of a group of monocrystals having an average grain size of about 2 μm can be formed.

This embodiment is effective for forming gold monocrystals having very smooth surfaces, because it seems that the iodine existing in the solution suppresses further nucleation on the gold crystals at the growth stage due to its gold-dissolving action.

Values of average grain size and nucleation density given by 1/(average grain size)$^2$ experimentally obtained by varied species of substrate surface material, complexes and growth conditions are given in Table 1. As is obvious from Table 1, the nucleation density depends on the species of substrate surface materials, complexes and growth conditions, and particularly strongly on the species of the substrate surface materials.

Embodiment 2-1

A process for selectively forming gold crystals will be explained below, referring to FIGS. 2A to 2C. That is, explanation will be made of an embodiment of carrying out the present invention, using a surface composed of Ti as a material having a larger nucleation density, a surface composed of $SiO_2$ as a smaller nucleation density, $[AuI_4]^-$ as a gold complex and evaporation as a means for a decomposition treatment.

At first, a Si wafer 201 is annealed and a thermally oxidized film 205 of $SiO_2$ is formed on the Si wafer surface. Then, Ti is vapor deposited on the entire oxidized film 205, and Ti thin films 202 of, for example, 30×50 μm square, were formed in a matrix pattern at distances of 200 μm on the $SiO_2$ film, as shown in FIG. 2A, whereby a substrate is obtained. For suppression of nucleation on the material having a smaller nucleation density, the distance of nucleation surfaces is desirably in such a range that no nuclei may be formed by a long-distance order, that is, a distance not more than the average grain size when the thin film is formed on the entire surface on the material having a smaller nucleation density.

Potassium iodide and iodine are put into distilled water to form an aqueous iodine solution, and then gold is put therein and dissolved with stirring to form a gold complex solution containing gold complex $[AuI_4]^-$. It seems that the solution contains $I_3^-$ and $K^+$ besides the gold complex $[AuI_4]^-$.

An aqueous iodine solution can be prepared by dissolving other iodide compounds than potassium iodide, for example, ammonium iodide. An alcoholic iodine solution in alcohol as a solvent or an aqueous-alcoholic iodine solution in a solvent mixture of alcohol and water can be also used in the present invention. The amount of dissolved gold depends on the concentration of iodine and iodide compound in the solution.

Then, the surface of the substrate is brought in contact with the solution, and then the solution is heated to a temperature of 30°-100° C. to promote evaporation of the iodine components. It seems that in the solution decomposition proceeds due to the evaporation of the iodine components existing in the $I_3^-$ state and the consequent dissociation of the iodine component from $[AuI_4]^-$ to maintain the equilibrium state of the solution or due to the direct evaporation of the iodine components existing in the form of $[AuI_4]^-$ form the complexes, and as a result the gold is brought into a supersaturated state.

Figure 2A:
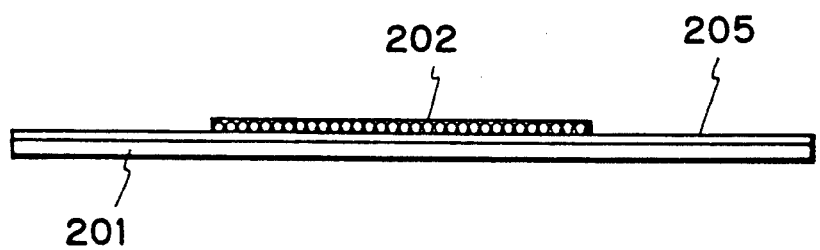
FIGS. 2A to 2C are schematic views each showing another embodiment of a process for forming a gold crystal film according to the present invention.
Figure 2B:
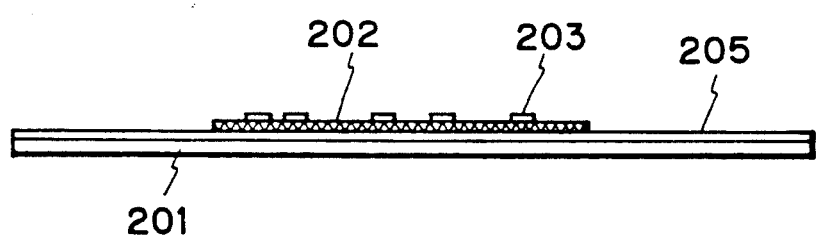

The gold in the supersaturated state in the solution deposits as random nuclei 203 only on the surface of the Ti film 202 having a greater nucleation density (FIG. 2B).

A result of analysis reveals that the thus formed crystals are defect-free monocrystals with the (111) orientation. A result of observation of growth rate reveals that the growth proceeds in a ratio of the growth rate in the longitudinal direction to that in the lateral direction of 1:100-200.

Figure 2C:
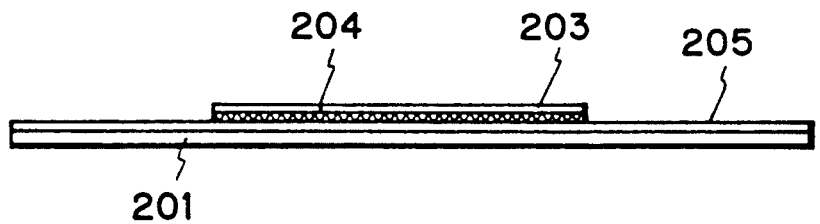

With continued growth, the crystals themselves contact one another to form grain boundaries 204, as shown in FIG. 2C to cover the surfaces of the surfaces composed of the material having a greater nucleation density. Thus, a crystalline gold thin film composed of a group of monocrystals having an average grain size of about 2 μm and a maximum grain size of about 5 μm can be selectively formed. No nucleation is found at all on the surfaces composed of the material having a smaller nucleation density.

This embodiment is effective for forming gold monocrystals having very smooth surfaces, because it seems that the iodine existing in the solution suppresses further nucleation on the gold crystals at the growth stage due to its gold-dissolving action.

In this embodiment, the surface composed of a material having a smaller nucleation density and the surface composed of a material having a larger nucleation density are not limited, and must have a relative difference in the nucleation density therebetween.

The maximum disposition distance of the individual surfaces composed of a material having a larger nucleation density is desirably within an average grain size when the surface composed of a material having a larger nucleation density is formed on the entire surface of a surface composed of a material having a smaller nucleation density under the same conditions as above. In other words, it is preferable to use an insulator material having a particularly smaller nucleation density such as $SiO_2$, SiN, SiC, or $Al_2O_3$ to obtain a maximum disposition distance. The material having a greater nucleation density for use in the present invention includes electroconductor materials and semiconductor materials such as Au, Ti, Cu, W, WSi, MoSi, Fe, Si and Ge.

The gold complex for use in the present invention includes gold complexes such as $[AuI_4]^-$, $[AuCl_4]^-$, $[Au(CN)_2]^-$, and $[Au(CN)_3]^-$.

Evaporation or a reducing agent can be used as a means for a decomposition treatment in the present invention. The reducing agent includes substances having a reducing action in a solution, such as hydroquinone, pyrogallol, pyrocatechol, glycine, metolhydroquinone, amidol, metol, sodium sulfite, and sodium thiosulfate.

All the above-mentioned materials can be used in all other embodiments of the present invention.

Embodiment 2-2

Explanation will be made below of an embodiment of the present invention of using a surface composed of Si as a surface composed of a material having a larger nucleation density, a surface composed of $SiO_2$ as a surface composed of a material having a smaller nucleation density, $[AuI_4]^-$ as a gold complex and evaporation as a means for a decomposition treatment, referring to FIGS. 3A and 3B.

At first, a Si wafer 301 is subjected to a thermal oxidation treatment to form a thermally oxidized film 305 of $SiO_2$ on the surface of the Si wafer 301. Then, Si surfaces 302 having a size of approximately $100 \times 100$ $\mu$m square are exposed from the $SiO_2$ film by etching with a resist, as shown in FIG. 3A, whereby a substrate having the exposed Si surfaces 302 in a matrix pattern at distances of, for example, 300 $\mu$m is obtained.

In this embodiment, the exposed Si wafer surface is used as a surface composed of a material having a greater nucleation density and the $SiO_2$ surface formed by thermal oxidation as a surface composed of a material having a smaller nucleation density.

Then, the substrate is dipped in dilute hydrofluoric acid to remove the surface oxide film from the Si surface and then crystal growth from $[AuI_4]^-$ as the gold complex, by an evaporation treatment as a means for a decomposition treatment is carried out in the same manner as in Embodiment 2-1. With further crystal growth, the crystals themselves contact one another to form grain boundaries 304, as shown in FIG. 3B, whereby a gold crystal thin film composed of a group of monocrystals having an average grain size of about 20 $\mu$m and a maximum grain size of about 40 $\mu$m can be selectively obtained. No nucleation is observed at all on the $SiO_2$ surface having a low nucleation density.

Embodiment 2-3

Figure 4A:
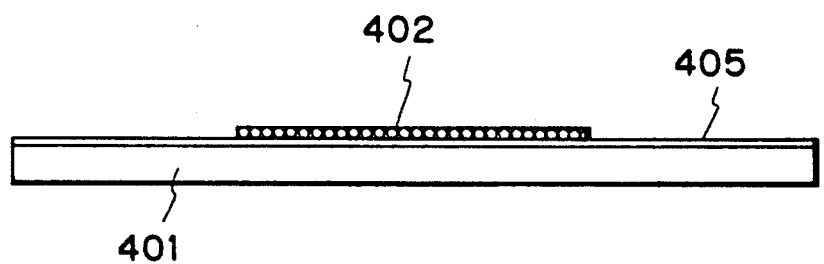
FIGS. 4A and 4B are schematic views each showing still other embodiment of a process for forming a gold crystal film according to the present invention.
Figure 4B:
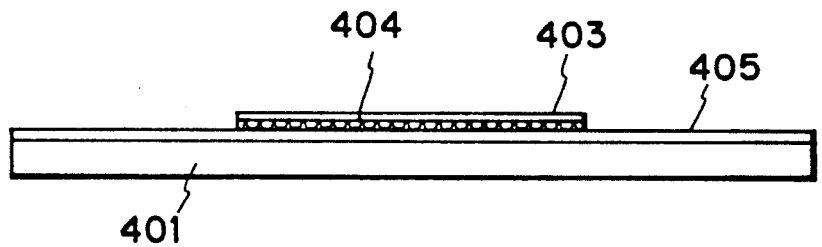

Explanation will be made below of an embodiment of the present invention, using a surface composed of Si as a plain composed of a material having a larger nucleation density, a surface composed of $SiO_2$ as a surface composed of a material having a smaller nucleation density, $[AuI_4]^-$ as a gold complex and a reducing agent as a means for a decomposition treatment, referring to FIGS. 4A and 4B.

At first, a Si wafer 401 is subjected to a thermal oxidation treatment to form a thermally oxidized film 405 of $SiO_2$ on the wafer surface. Then, a poly-Si (P-Si) film is formed on the entire surface of the $SiO_2$ film 405 by, e.g., LP-CVD. P-Si surfaces 402 each having a size of about $100 \times 100$ $\mu$m are retained in a matrix pattern at distances, for example, of 400 $\mu$m on the $SiO_2$ film by etching with a resist, as shown in FIG. 4A, to prepare a substrate.

In this embodiment, the P—Si surfaces are used as surfaces composed of a material having a larger nucleation density and the $SiO_2$ surfaces obtained by thermal oxidation as surfaces composed of a material having a smaller nucleation density.

The substrate is dipped in dilute hydrofluoric acid to remove the surface oxide film from the surfaces of the P—Si surfaces, and then brought into contact with a gold complex solution. Then, an aqueous hydroquinone solution is slowly dropwise added thereto to conduct crystal growth.

With the crystal growth the crystals themselves contact one another to form grain boundaries 404 and cover the surfaces of surfaces composed of a material having a larger nucleation density, whereby a gold crystal thin film 403 composed of a group of monocrystals having an average grain size of about 15 $\mu$m and a maximum grain size of about 20 $\mu$m can be selectively formed. No nucleation is observed on the surfaces of surfaces composed of a smaller nucleation density, i.e. $SiO_2$.

Embodiment 2-4

Figure 5A:
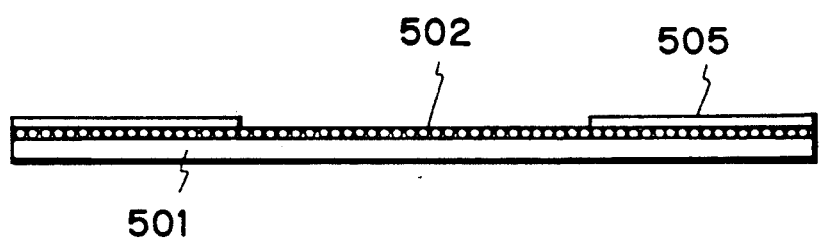
FIGS. 5A and 5B are schematic views each showing further embodiment of a process for forming a gold crystal film according to the present invention.

Explanation will be made below, referring to FIGS. 5A and 5B.

Ti is vapor deposited on the entire surface of a Si wafer 501 and then a $SiO_2$ film 505 is formed on the entire surface of the thus deposited Ti film 502 by ECR-CVD. Then, Ti surfaces 502 having a size of $50 \times 50$ $\mu$m square are exposed in a matrix pattern at distances of 200 $\mu$m from the $SiO_2$ film 505 by etching with a resist, as shown in FIG. 5A.

In this embodiment, the exposed Ti surfaces are used as surfaces composed of a material having a larger nucleation density and the $SiO_2$ surfaces as surfaces composed of a material having a smaller nucleation density. Then, crystal growth is conducted in the same manner as in Embodiment 2-1, using $[AuI_4]^-$ as a gold complex and an evaporation treatment as a means for a decomposition treatment.

Figure 5B:
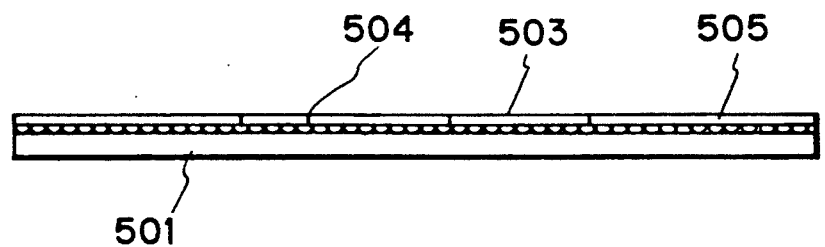

With the crystal growth, crystals themselves contact one another to form grain boundaries 504 as shown in FIG. 5B.

Embodiment 3-1

Explanation will be made below, referring to FIGS. 6A to 6B and 7A to 7D.

That is, explanation will be made below of an embodiment of the present invention, using Ti surfaces as surfaces composed of a material having a larger nucleation density, $SiO_2$ surfaces as surfaces having a smaller nucleation density, $[AuI_4]^-$ as gold complexes and evaporation as a decomposition means.

Figure 6A:
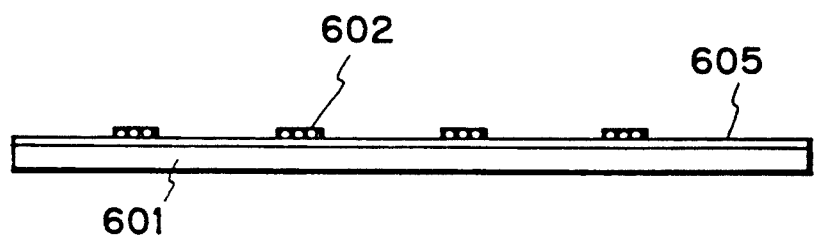
FIGS. 6A to 6C are schematic views each showing still further embodiment of a process for forming a gold crystal film according to the present invention.
Figure 7A:
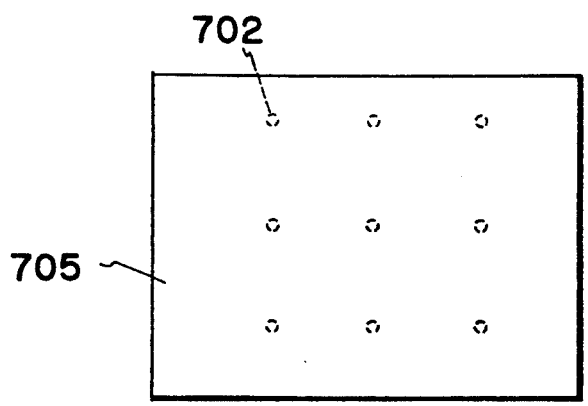
FIGS. 7A to 7D are schematic views each showing still further embodiment of a process for forming a gold crystal film according to the present invention.

At first, a Si wafer 601 is subjected to a thermal oxidation treatment to form a thermally oxidized film 605 or 705 on the surface of the Si wafer. Then, Ti is vapor deposited on the entire surface of the oxide film, and Ti surfaces 602 or 702, 1×1 μm square, are formed in a matrix pattern at distances of 50 μm on the SiO$_2$ film by etching with a resist, as shown in FIGS. 6A and 7A, to obtain a substrate.

In the present invention, nucleation can be carried out only on a single nucleus by making the surfaces composed of a material having a larger nucleation density having a sufficiently small area. The size of the individual surface is preferably 10 μm or less, more preferably 5 μm or less.

The distance of the nucleation surfaces is preferably within such a range that no nucleus may be formed by a long-distance order in order to suppress nucleation on the surfaces composed of a material having a smaller nucleation density, that is, a distance less than the average grain size when the thin film is formed on the entire surface of the surface composed of a material having a smaller nucleation density.

Potassium iodide and iodine are put into distilled water to form an aqueous iodine solution, and then gold is put into the solution and dissolved therein with stirring to form a gold complex solution containing [AuI$_4$]$^-$.

It seems that the solution contains I$_3^-$ and K$^+$ besides the gold complex [AuI$_4$]$^-$.

An aqueous iodine solution can be also prepared by dissolving other iodine compounds than potassium iodide, for example, ammonium iodide, into distilled water. An alcoholic iodine solution using alcohol as a solvent, or an alcoholic-aqueous iodine solution using a mixture of alcohol and water as a solvent can be also used. The amount of dissolved gold depends on the concentration of iodine and an iodine compound in the solution.

Then, the surface of the substrate is brought into contact with the solution, and the solution is heated to a temperature of 30°-100° C. to promote evaporation of the iodine components.

Figure 6B:
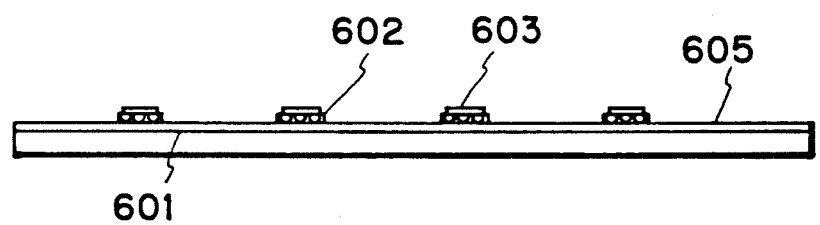
Figure 7B:
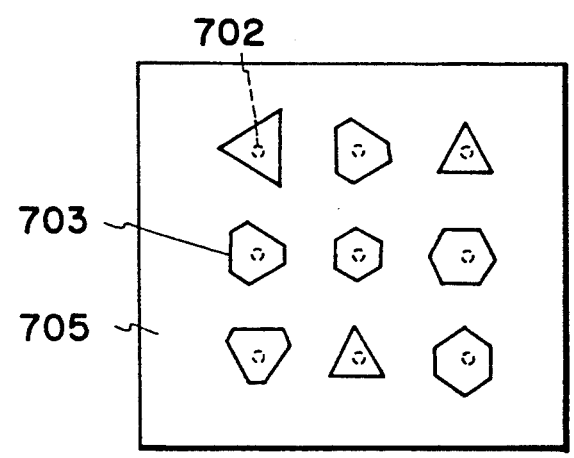

It seems that in the solution, decomposition proceeds due to dissociation of the iodine components from [AuI$_4$]$^-$ to maintain the equilibrium state of the solution compensating the evaporation of the iodine components existing in the I$_3^-$ state, or due to the direct evaporation of the iodine component from the complexes existing in the form of [AuI$_4$]$^-$. As a result, gold is brought into a supersaturated state. The gold in the supersaturated state in the solution deposits as single nuclei 603 and 703 only on the surfaces of the Ti surfaces having a larger nucleation density, as shown in FIGS. 6B and 7B. No nucleation is observed at all on the surfaces composed of a material having a smaller nucleation density.

A result of analysis reveals that the formed crystals are defect-free monocrystals with the (111) orientation. A result of observation of the growth rate reveals that the growth is made in a ratio of the growth in the longitudinal direction to that in the lateral direction of 1:100-200.

Figure 6C:
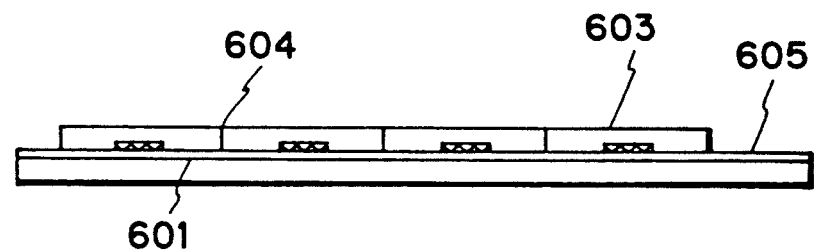
Figure 7C:
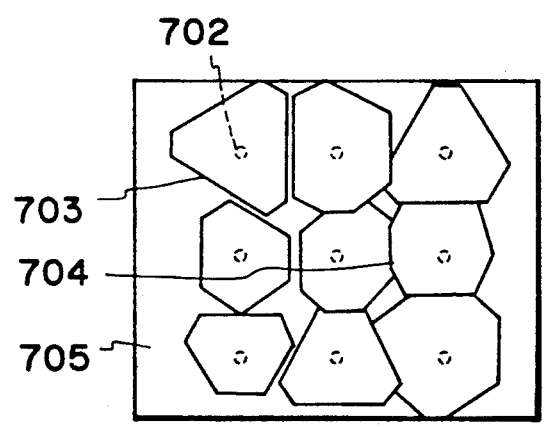
Figure 7D:
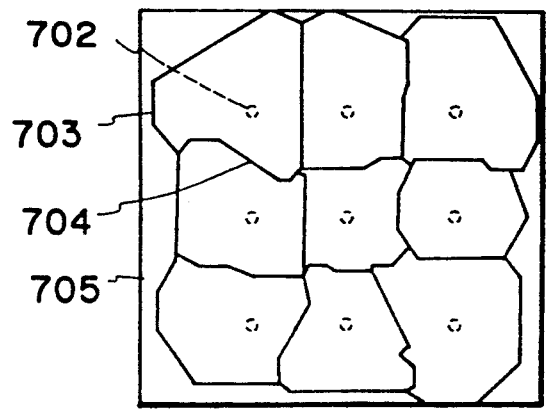

With continued crystal growth, crystals themselves contact one another to form grain boundaries 604 and 704 at approximately middle positions between the adjacent surfaces composed of a material having a larger nucleation density, as shown in FIGS. 6C and 7C and 7D and to cover the surfaces composed of a material having a smaller nucleation density, whereby a gold crystal thin film composed of monocrystals having grain sizes of about 50 μm can be formed. The location of gold monocrystals to be formed (locations of crystals and grain boundaries) can be changed as desired in the present invention.

This embodiment is effective for forming gold monocrystals having very smooth surfaces, because it seems that the iodine existing in the solution suppresses further nucleation on the growing gold crystals due to its gold-dissolving action.

Embodiment 3-2

Explanation will be made below of an embodiment of the present invention, using Si surfaces as surfaces composed of a material having a larger nucleation density, SiO$_2$ surfaces as surfaces composed of a material having a smaller nucleation density, [AuI$_4$]$^-$ as a gold complex, and a reducing agent as a means for a decomposition treatment.

At first, a Si wafer is subjected to a thermal oxidation treatment to form a thermally oxidized film of SiO$_2$ on the surface of the Si wafer. Then, a poly-Si (P-Si) film is formed on the entire surface of the SiO$_2$ film by LP-CVD. Circular P-Si surfaces, for example, 5 μm in diameter, are retained in a matrix pattern at distances of 50 μm on the SiO$_2$ film by etching with a resist to obtain a substrate.

Then, the substrate is dipped in dilute hydrofluoric acid to remove the surface oxide film from the P-Si surfaces, and then brought into contact with a gold complex solution. Then, an aqueous hydroquinone solution is slowly dropwise added thereto to conduct crystal growth. With crystal growth crystals themselves contact one another to form grain boundaries to cover the surfaces composed of a material having a smaller nucleation density, whereby monocrystals having an average grain size of 50 μm can be selectively formed.

Embodiment 3-3

Figure 8A:
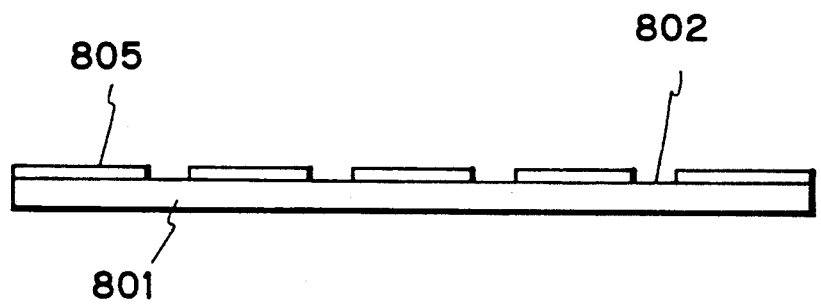
FIGS. 8A to 8C are schematic views each showing still further embodiment of a process for forming a gold crystal film according to the present invention.
Figure 8B:
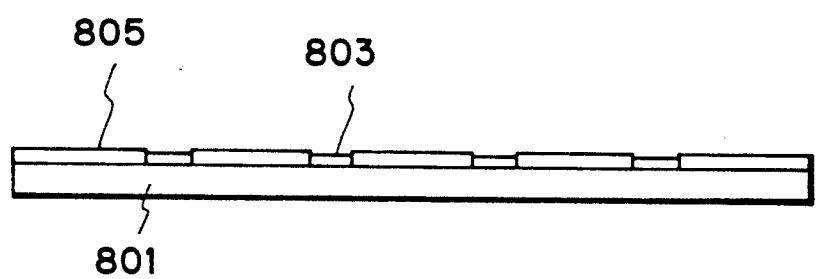
Figure 8C:
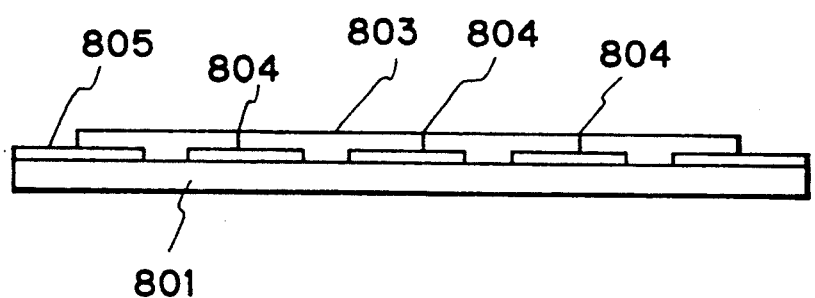

Explanation will be made below of an embodiment of the present invention, using Si surfaces as surfaces composed of a material having a larger nucleation density, SiO$_2$ surfaces as surface composed of a material having a smaller nucleation density, [AuI$_4$]$^-$ as a gold complex and evaporation treatment as a means for a decomposition treatment, referring to FIGS. 8A to 8C.

A Si wafer 801 is subjected to a thermal oxidation treatment to form a thermally oxidized film 805 of SiO$_2$ on the surface of the Si wafer 801. Then, circular Si surfaces 802, for example, 10 μm in diameter, are exposed in a matrix pattern at distances of 30 μm from the SiO$_2$ film 805 by etching with a resist, as shown in FIG. 8A, to obtain a substrate. Then, the substrate is dipped in dilute hydrofluoric acid to remove the surface oxide film, and crystal growth is conducted in the same manner as in Embodiment 3-1. With continued crystal growth, crystals themselves contact one another to form grain boundaries 804 at approximately middle positions between the adjacent surfaces composed of a material having a larger nucleation density, as shown in FIG. 8C, whereby a gold crystal thin film composed of monocrystals having grain sizes of about 30 μm can be formed.

Embodiment 3-4

Figure 9A:
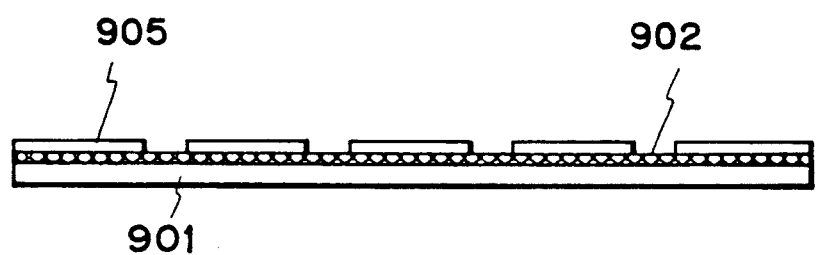
FIGS. 9A and 9B are schematic views each showing still further embodiment of a process for forming a gold crystal film according to the present invention.

Explanation will be made below of an embodiment of the present invention, using Ti surfaces as surface composed of a material having a larger nucleation density, SiO$_2$ surfaces as surfaces composed of a material having a smaller nucleation density, [AuI$_4$]$^-$ as a gold complex and evaporation treatment as a means for a decomposition treatment, referring to FIGS. 9A and 9B.

Ti is vapor deposited on the entire surface of a Si wafer 901 and then a SiO$_2$ film 905 is formed on the entire surface of the Ti film by ECR-CVD. Then, circular Ti surfaces 902, 1 μm in diameter, are exposed in a matrix pattern at distances of 10 μm from the SiO₂ film by etching with a resist, as shown in FIG. 9A to obtain a substrate.

Figure 9B:
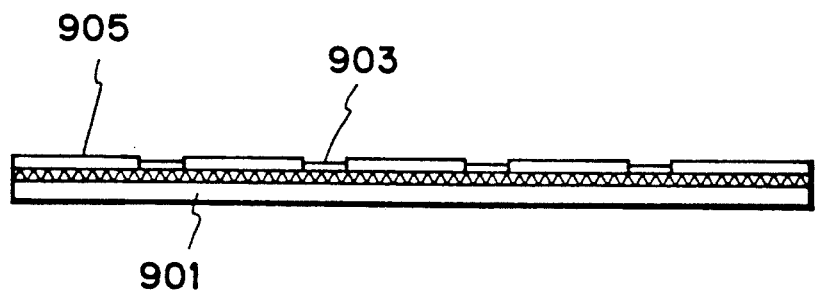

Crystal growth is conducted on the substrate in the same manner as in Embodiment 3-1, whereby gold monocrystals 903 are filled in the recesses, as shown in FIG. 9B.

Explanation will be made below of embodiments of the present invention, where a gold crystal film is formed by adding an etching species having an etching action on a substrate material to a gold complex solution and controlling the number of the formed nuclei and the size of crystal grains.

A process for forming a gold thin film composed of a group of gold monocrystals on a substrate by subjecting a gold complex in a gold complex solution to a decomposition treatment in the presence of an etching species acting on a substrate material to transfer the gold in the solution to a supersaturated state will be explained below, referring to an embodiment of forming the thin film using a SiO₂ substrate, $[AuI_4]^-$ as a gold complex and an evaporation treatment as a means for a decomposition treatment and referring also to FIGS. 1A to 1D.

At first, potassium iodide and iodine are put into distilled water to prepare an aqueous iodine solution, and then gold is put into the solution and dissolved therein with stirring to form a gold complex solution containing $[AuI_4]^-$. Then, hydrofluoric acid is dropwise added to the solution and mixed therewith. It seems that the resulting solution contains $I_3^-$, $K^+$ and $F^-$ as main components besides the gold complex $[AuI_4]^-$.

Then, the surface 102 of the SiO₂ substrate 101 is brought into contact with the solution, and the solution is heated to a temperature of 30°–100° C. to promote evaporation of the iodine components.

It seems that in the solution, decomposition proceeds due to dissociation of the iodine components from $[AuI_4]^-$ to maintain the equilibrium state of the solution compensating the evaporation of the iodine components existing in the $I_3^-$ state, or due to the direct evaporation of the iodine component from the complexes existing in the form of $[AuI_4]^-$, and as a result gold is brought into a supersaturated state.

The gold in the supersaturated state in the solution deposits as random nuclei 103 on the surface 102 of the substrate 101, as shown in FIG. 1A. Then, nucleation continues for a while, but when some number of nuclei are formed, the increase in the nuclei is discontinued, and the nuclei grow self-matchingly into monocrystals, as shown in FIG. 1B. With continued crystal growth, the individual monocrystals contact one another to form grain boundaries, as shown in FIGS. 1C and 1D. The grain size of the individual monocrystals depends on the species of the substrate and the gold complex and also on the amount of etching species on the substrate surface. A result of determination of influences of hydrofluoric acid concentration upon the grain size of gold monocrystal is shown in Table 1. The presence of etching species (hydrofluoric acid) acting on the substrate surface can make the grain size of the monocrystals in maximum about three times as large as that when there is no such etching species. At too a low concentration of the etching species, no etching action occurs, whereas at too a high concentration no nucleation appears on the substrate surface.

Embodiment 4-1

Explanation will be made below of an embodiment of forming gold crystals on a SiO₂ substrate 101, using $[AuI_4]^-$ as gold complexes and an evaporation treatment as a means for a decomposition treatment, referring to FIGS. 1A to 1D.

At first, potassium iodide and iodine are put into distilled water, and then gold is put into the solution and dissolved therein with stirring to prepare a gold complex solution containing $[AuI_4]^-$. Then, hydrofluoric acid is dropwise added to the solution and mixed therewith. It seems that the solution contains $I_3^-$, $K^+$ and $F^-$ as main components besides the gold complexes $[AuI_4]^-$.

An aqueous iodine solution can be also prepared by dissolution of other iodide compounds than potassium iodide, for example, ammonium iodide. An alcoholic iodide solution in alcohol as a solvent or an alcoholic-aqueous iodine solution in a solvent mixture of alcohol and water can be also used in the present invention. The amount of dissolved gold depends on the concentration of iodine and iodide compound in the solution, and the concentration of hydrofluoric acid has an influence on the grain size of gold monocrystals.

Then, the surface 102 of a SiO₂ substrate 101 is brought into contact with the solution, and then the solution is heated to a temperature of 30°–100° C. to promote evaporation of the iodine components.

It seems that in the solution, decomposition proceeds due to dissociation of the iodine components from $[AuI_4]^-$ to maintain the equilibrium state of the solution compensating the evaporation of the iodine components existing in the $I_3^-$ state, or due to the direct evaporation of the iodine components from the complexes existing in the form of $[AuI_4]^-$. As a result, the gold is brought into a supersaturated state.

The gold in the supersaturated state in the solution deposits as random nuclei 103 on the substrate surface 102, as shown in FIG. 1A.

About 3 minutes after the start of growth, the crystals grow to grain sizes of about 40 μm as maximum, as shown in FIG. 1B. The thus formed crystals are defect-free monocrystals with the (111) orientation. The growth rate is in a ratio of the growth rate in the longitudinal direction to that in the lateral direction of 1:100–200.

With continued growth, individual crystals themselves contact one another to form grain boundaries 104 and cover the substrate surface, as shown in FIGS. 1C and 1D, whereby a gold crystal thin film composed of a group of monocrystals having an average grain size of about 0.5 to about 1.5 mm can be formed. The average grain size depends on the concentration of hydrofluoric acid. At too a low concentration no etching action occurs and no larger crystals grow, whereas at too a low concentration no nucleation takes place.

In this embodiment, a group of gold monocrystals having very large grain sizes can be formed, since it seems that the hydrofluoric acid in the solution acts on the SiO₂ substrate 101 to etch the substrate surface 102 little by little. It seems that the etching action on the substrate surface suppresses the nucleation rate of gold crystals on the substrate surface 102, and as a result the grain size of gold monocrystals formed on the substrate surface 102 is larger than that of gold monocrystals formed without etching the substrate surface 102, resulting in formation of a gold crystal thin film composed of a group of gold monocrystals having larger grain sizes.

This embodiment is effective for forming gold monocrystals having very smooth surfaces, because it seems that the iodine existing in the solution suppresses further nucleation on the gold crystals at the growth stage due to its gold-dissolving action.

Embodiment 4-2

Explanation will be made below of an embodiment of forming gold crystals on a $SiO_2$ substrate 101, using $[AuI_4]^-$ as gold complexes and a reducing agent as a means for a decomposition treatment.

A gold complex solution containing $[AuI_4]^-$ and hydrofluoric acid is prepared in the same manner as in Embodiment 4-1. Then, the surface 102 of the $SiO_2$ substrate 101 is brought in contact with the solution, and then an aqueous $Na_2SO_3$ solution as a reducing agent is slowly dropwise added to the solution, while being kept at room temperature. It seems that in the solution, decomposition proceeds due to dissociation of the iodine components from $[AuI_4]^-$ to maintain the equilibrium state of the solution compensating ionization of the iodine components existing in the $I_2$ state of $2I^-$, and as a result the gold is brought into a supersaturated state and nuclei 103 are formed at random on the substrate surface 102, as shown in FIG. 1A.

In case of using a reducing agent as a means for a decomposition treatment as in this embodiment, nuclei are formed in the solution at a high concentration of the reducing agent, and consequently no crystals are formed on the substrate surface or very fine polycrystals are formed.

About 3 minutes after the start of growth, the crystals 103 having grain sizes of about 40 μm as maximum grow, as shown in FIG. 1B. With continued growth, the individual crystals contact one another to form grain boundaries 104 and to cover the substrate surface, as shown in FIGS. 1C and 1D, whereby a gold crystal thin film composed of a group of monocrystals having an average grain size of about 0.2 to about 0.6 mm can be formed. The structure and shape of the thus obtained crystals are the same as in Embodiment 4-1. The average grain size depends on the concentration of hydrofluoric acid, and no etching action appears at too a low concentration, whereas no nucleation appears at too a high concentration.

In this embodiment, a group of gold monocrystals having very large grain sizes can be formed, because it seems that the hydrofluoric acid in the solution acts on the $SiO_2$ substrate 101 to etch the substrate surface 102 little by little, as in Embodiment 4-1. It seems that the etching action on the substrate surface suppresses the nucleation rate of gold-crystals on the substrate surface and as a result the grain size of gold monocrystals formed on the substrate surface is larger than that of the crystals formed when there is no etching action on the substrate surface 102, resulting in formation of a gold crystal thin film composed of gold monocrystals having larger grain sizes. This embodiment is also effective for forming gold monocrystals having very smooth surfaces, because it seems that the iodine existing in the solution suppresses further nucleation on the gold crystals at the growth stage due to its gold-dissolving action.

Embodiment 4-3

Explanation will be made below of an embodiment of the present invention, using Si surfaces as surfaces composed of a material having a larger nucleation density, $SiO_2$ surfaces as surfaces composed of a material having a smaller nucleation density, $[AuI_4]^-$ as gold complexes, HF (hydrofluoric acid) as an etching species and an evaporation treatment as a means for a decomposition means, and referring to FIGS. 2A to 2C.

A poly Si (P-Si) film is formed by LP-CVD on the entire surface of the thermally oxidized film of $SiO_2$ formed on the surface of a Si wafer, and then island-shaped p-Si 202 are formed in a matrix pattern on the $SiO_2$ film 205, as shown in FIG. 2A to prepare a substrate.

Potassium iodide and iodine are put into distilled water to form an aqueous iodine solution, and then gold is put into the solution and dissolved therein with stirring to prepare a gold complex solution containing $[AuI_4]^-$. Then, hydrofluoric acid is dropwise added to the solution and mixed therewith. It seems that the solution contains $I_3^-$, $K^+$ and $F^-$ as main components besides the gold complex $[AuI_4]^-$.

An aqueous iodine solution can be also prepared with other iodide compound than potassium iodide, for example, ammonium iodide, or an alcoholic iodide solution in alcohol as a solvent or an alcoholic-aqueous iodide solution in a solvent mixture of alcohol and water can be also used in the present invention. The amount of dissolved gold depends on the concentration of iodine and iodide compound in the solution. The added hydrofluoric acid makes shallow etching of the $SiO_2$ surface as surfaces composed of a material having smaller nucleation density, making the gold nucleation density on the surface much smaller than that when no hydrofluoric acid is added. Further suppression of the nucleation density means that a larger distance can be provided between positions of the material having a larger nucleation density provided in the matrix pattern. The greater the concentration of hydrofluoric acid, the greater the effect of suppressing the nucleation density. However, the $SiO_2$ surfaces are rapidly etched at too a high concentration and thus the concentration is determined in view of correlations between the thickness of the $SiO_2$ film and the effect of suppressing the nucleation density.

Then, the surface 205 of the substrate is brought in contact with the solution, and then the solution is heated to a temperature of 30°–100° C. to promote the evaporation of the iodine components.

It seems that in the solution, decomposition proceeds due to dissociation of the iodine components from $[AuI_4]^-$ to maintain the equilibrium state of the solution compensating the evaporation of the iodine components existing in the $I_3^-$ state, or due to the direct evaporation of the iodine components from the complexes existing in the form of $[AuI_4]^-$. As a result the gold is brought into a supersaturated state.

The gold in the supersaturated state in the solution deposits as random nuclei 203 only on p-Si surface 202 having a larger nucleation density, as shown in FIG. 2B. The thus formed crystals are defect-free monocrystals with the (111) orientation. A result of observing the growth rate reveals that the growth proceeds in a rate of the growth rate in the longitudinal direction to that in the lateral direction of 1:100–200. With continued growth, the individual crystals themselves contact one another to form grain boundaries 204 and to cover the surfaces composed of a material having a larger nucleation density, as shown in FIG. 2C, whereby a gold crystal thin film composed of monocrystals can be selectively formed.

This embodiment is effective for forming gold monocrystals having very smooth surfaces, because it seems that the iodine existing in the solution suppresses further nucleation on the gold crystals at the growth stage due to its gold-dissolving action.

Embodiment 4-4

Explanation will be made below of an embodiment of the present invention using Si surfaces as surfaces composed of a material having a larger nucleation density, $SiO_2$ surfaces composed of a material having a smaller nucleation density, $[AuI_4]^-$ as gold complexes, HF (hydrofluoric acid) as an etching species, and a reducing agent as a means for a decomposition treatment, referring to FIGS. 3A and 3B.

Figure 3A:
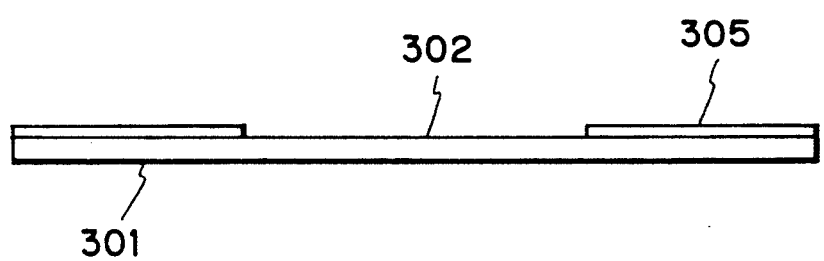
FIGS. 3A and 3B are schematic views each showing other embodiment of a process for forming a gold crystal film according to the present invention.
Figure 3B:
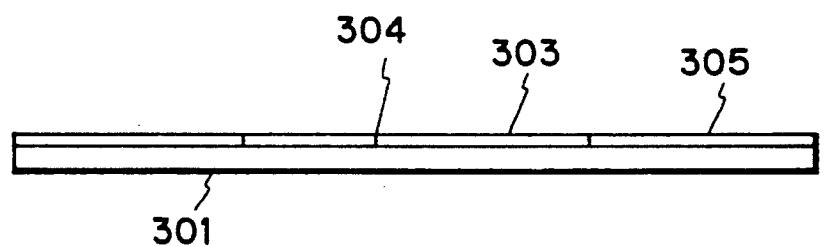

Holes are made through the thermally oxidized film 305 formed on the surface of a Si wafer 301 by etching, as shown in FIG. 3A, to prepare a substrate with exposed Si surfaces 302.

Potassium iodide and iodine are put into distilled water in the same manner as Embodiment 4-3 to prepare an aqueous iodine solution, and then gold is put into the solution and dissolved therein with stirring to prepare a gold complex solution containing $[AuI_4]^-$. Then, hydrofluoric acid is dropwise added to the solution and mixed therewith.

Then, the surface of the substrate is brought into contact with the solution, and then an aqueous sodium sulfite solution is slowly dropwise added thereto to conduct crystal growth.

It seems that in the solution, decomposition proceeds due to dissociation of the iodine components from $[AuI_4]^-$ to maintain the equilibrium state of the solution compensating ionization of the iodine components existing in the $I_2.I^-$ state to $3I^-$. As a result, the gold is brought into a supersaturated state and nuclei are formed at random on the surfaces having a larger nucleation density. With continued growth, the individual crystals themselves contact one another to form grain boundaries 304 and to cover the surfaces composed of a material having a larger nucleation density, as shown in FIG. 3B, whereby a gold crystal thin film composed of a group of monocrystals can be selectively formed. No nucleation appears on the surfaces composed of a material having a smaller nucleation density. The thus formed crystals are defect-free monocrystals with the (111) orientation. A result of observing the growth rate reveals that the crystal growth proceeds in a ratio of the growth rate in the longitudinal direction to that in the lateral direction of 1:100-200.

Embodiment 4-5

Explanation will be made below of an embodiment of the present invention, using Si surfaces as surfaces composed of a material having a larger nucleation density, $SiO_2$ surfaces as surfaces composed of a material having a smaller nucleation density, $[AuI_4]^-$ as gold complexes, hydrofluoric acid as an etching species, and an evaporation treatment as a means for a decomposition treatment, referring to FIGS. 6A to 6C and 7A to 7D.

A poly Si (p-Si) film is formed by LP-CVD on the entire surface of the thermally oxidized films 605 and 705 of $SiO_2$ formed on the surface of a Si wafer 601, and then p-Si films 602 and 702 of 10 μm square are formed in a matrix pattern at distances of 1.5 mm on the $SiO_2$ film by etching with a resist, as shown in FIGS. 6A and 7A to prepare a substrate.

Potassium iodide and iodine are put into distilled water to prepare an aqueous iodine solution, and then gold is put into the solution and dissolved therein with stirring to prepare a gold complex solution containing $[AuI_4]^-$. Then, hydrofluoric acid is dropwise added to the solution and mixed therewith. It seems that the solution contains $I_3^-$, $K^+$ and $F^-$ besides the gold complex $[AuI_4]^-$.

Then, the surface of the substrate is brought in contact with the solution, and the solution is heated to a temperature of 30°-100° C. to promote evaporation of the iodine components.

It seems that in the solution, decomposition proceeds due to dissociation of the iodine components from $[AuI_4]^-$ to maintain the equilibrium state of the solution compensating the evaporation of the iodine component existing in the $I_3^-$ state, or due to the direct evaporation of the iodine components from the complexes existing in the form of $[AuI_4]^-$. As a result, the gold is brought into a supersaturated state. The gold in the supersaturated state in the solution deposits as single nuclei 603 or 703 only on the surfaces of the Si surface having a larger nucleation density, as shown in FIGS. 6B and 7B.

The thus formed crystals are defect-free monocrystals with the (111) orientation. A result of observing the growth rate reveals that the growth proceeds in a ratio of the growth rate in the longitudinal direction to that in the lateral direction of 1:100-200. With continued growth, the individual crystals themselves contact one another to form grain boundaries 604 or 704 at approximately middle positions between the adjacent surfaces composed of a material having a larger nucleation density and to cover the surface composed of a material having a smaller nucleation density, as shown in FIGS. 6C and 7C and 7D, whereby a gold crystal thin film 603 or 703 composed of monocrystals can be formed. The positions of gold monocrystals to be formed, that is, positions of the crystals and grain boundaries, can be changed as desired in the present invention. A gold crystal thin film composed of a group of gold monocrystals formed according to the present invention can be utilized as a thin film wiring in the semiconductor integrated circuits.

In the present invention nucleation of only single nuclei can be obtained by making the surfaces composed of a material having a larger nucleation density have a sufficiently very smaller area each. The size for the area is preferably 10 μm or less and more preferably 5 μm or less.

An aqueous iodine solution can be also prepared with other iodide compounds than potassium iodide, for example, ammonium iodide. An alcoholic iodine solution in alcohol as a solvent or an alcoholic-aqueous iodine solution in a solvent mixture of alcohol and water can be also used in the present invention. The amount of dissolved gold depends on the concentration of iodine and iodide compound in the solution. The added hydrofluoric acid makes shallow etching of the $SiO_2$ surfaces as surfaces composed of a material having a smaller nucleation density, and thus the nucleation density of gold on the surface is much smaller than that when no hydrofluoric acid is added. Further suppression of the nucleation density means that larger mutual distances can be provided for the material having a larger nucleation density. The higher the concentration of hydrofluoric acid, the higher the effect of suppressing the nucleation density. However, the $SiO_2$ surfaces are rapidly etched at too a high concentration, and thus the concentration is determined in view of correlation between the thickness of $SiO_2$ film and the effect of suppressing the nucleation density.

Embodiment 4-6

Explanation will be made below of an embodiment of the present invention, using Si surfaces as surfaces composed of a material having a larger nucleation density, $SiO_2$ surfaces as surfaces composed of a material having a smaller nucleation density, $[AuI_4]^-$ as gold complexes, hydrofluoric acid as an etching species and a reducing agent as a means for a decomposition treatment.

Holes are provided through the thermally oxidized film formed on the surface of a Si wafer by etching to expose the Si surface, whereby a substrate is prepared.

Potassium iodide and iodine are put into distilled water in the same manner as in Embodiment 4-5 to prepare an aqueous iodine solution, and then gold is put into the solution and dissolved therein with stirring, whereby a gold complex solution containing $[AuI_4]^-$ is prepared. Then, hydrofluoric acid is dropwise added to the solution and mixed therewith.

Then, the surface of the substrate is brought in contact with the solution, and then an aqueous hydroquinone solution is slowly dropwise added thereto to conduct crystal growth.

It seems that in the solution decomposition proceeds due to ionization of the iodine components existing in the $I_2.I^-$ state to $3I^-$ and the consequent dissociation of the iodine components from $[AuI_4]^-$ to maintain the equilibrium state of the solution. As a result, the gold is brought into a supersaturated state. The gold in the supersaturated state in the solution deposits as single nuclei only on the surfaces of Si surfaces having a greater nucleation density.

The thus formed crystals are defect-free monocrystals with the (111) orientation. A result of observing the growth rate reveals that the growth proceeds in a ratio of the growth rate in the longitudinal direction to that in the lateral direction of 1:100-200. With continued growth, the holes are filled with the crystals.

The present invention can be carried out in various other embodiments than the above-mentioned embodiments.

In the present invention the surface composed of a material having a smaller nucleation density and the surface composed of a material having a larger nucleation density are not limited, and must have a relative difference in the nucleation density, and the material having a larger nucleation density can form a surface of sufficiently small area so as to form a single nucleus and the solution must contain an etching species capable of acting on the material having a smaller nucleation density.

It is desirable that the maximum distance at which the surfaces composed of a material having a larger nucleation density are provided is within the average grain size when a film is formed only on the entire surface of the surface composed of a material having a smaller nucleation density under the same conditions. In other words, it is preferable to use an insulator material having a particularly smaller nucleation density such as $SiO_2$, SiN, SiC, and $Al_2O_3$ as a material having a smaller nucleation density in order to obtain such a maximum distance.

As a material having a larger nucleation density, semiconductor materials and electroconductive materials such as Au, Ag, Cu, W, WSi, MoSi, Fe, Si and Ge can be used.

As a gold complex, $[AuI_4]^-$, $[AuCl_4]^-$, $[Au(CN)_2]^-$, $[Au(CN)_3]^-$ and $[AuBr_3]^{-2}$ can be used.

As an etching species, such acidic solutions as hydrofluoric acid, hydrochloric acid, nitric acid and sulfuric acid can be preferably used.

As a means for a decomposition treatment, evaporation by heating and a reducing agent can be used. As a reducing agent, hydroquinone, pyrogallol, pyrocatechol, glycine, metolhydroquinone, amidol, metol, sodium sulfite, sodium thiosulfate, etc. and other substances having a reducing action in a solution can be used.

The solutions, materials, etc. so far explained can be also used in other embodiments of the present invention.

EXAMPLES

The present invention will be explained below, referring to Examples, but is not limited thereto.

EXAMPLE 1

40 g of potassium iodide and 6 g of iodine were put into 500 ml of distilled water and dissolved therein with stirring. 3 g of gold was put into the resulting solution and dissolved therein with stirring. After the dissolution, 100 ml of the solution was sampled and charged into a reactor vessel, and stirred while adding 500 ml of distilled water was added thereto. The surface of a Si wafer substrate with a 0.5 μm-thick thermally oxidized film formed on the surface was brought in contact with the solution. Then, the solution was heated to 80° C. and left standing at that temperature. One hour after the contact, the substrate was taken out of the solution and inspected. It was found that a group of monocrystals with (111) planes was formed on the thermally oxidized film, and grain boundaries were formed between the monocrystals. It was found that the average grain size was 560 μm and the film thickness of the group of monocrystals was about 2 μm. A result of inspection by STM (scanning tunnel microscope) revealed that the surface irregularity of the individual monocrystals was 5 Å in 1 μm square.

EXAMPLE 2

40 g of potassium iodide and 6 g of iodine were put into 500 ml of distilled water and dissolved therein with stirring. 3 g of gold was put into the solution and dissolved therein with stirring. After the dissolution, 100 ml of the solution was sampled and placed in a reactor vessel, and stirred, while adding 500 ml of distilled water thereto. Then 50 ml of an aqueous solution containing 100 mg of hydroquinone dissolved therein was slowly added to the solution. The surface of a Si substrate, from which a surface oxide film was removed with dilute hydrofluoric acid, was brought in contact with the solution and left standing as such at room temperature. 3 hours thereafter, the substrate was taken out of the solution and inspected. It was found that a group of monocrystals with (111) surfaces was formed on the Si substrate, and the average grain size was 15 μm and the thickness of the group of monocrystals was about 0.2 μm.

EXAMPLE 3

40 g of potassium iodide and 6 g of iodine were put into 500 ml of distilled water and dissolved therein with stirring. Then, 2 g of gold was put into the solution and dissolved therein with stirring. After the dissolution, 100 ml of the solution was sampled and placed into a reactor vessel, and stirred while adding 300 ml of distilled water thereto. Then, the surface of a Si substrate, from which a surface oxidized film was removed with dilute hydrofluoric acid, was brought in contact with the solution, while heating the solution to 80° C. One hour thereafter, the substrate was taken out of the solution and inspected. It was found that a group of monocrystals with (111) planes was formed on the Si substrate, and the average grain size was 20 μm and the thickness of the group of monocrystals was about 0.3 μm.

EXAMPLE 4

40 g of potassium iodide and 6 g of iodine were put into 500 ml of distilled water and dissolved therein with stirring. Then, 3 g of gold was put into the solution and dissolved therein with stirring. After the dissolution, 100 ml of the solution was sampled and placed into a reactor vessel and stirred while adding 500 ml of distilled water thereto. The surface of a Si wafer substrate with a 0.5 μm-thick thermally oxidized film formed on the surface was brought in contact with the solution, while heating the solution to 80° C., and left standing as such. One hour thereafter, the substrate was taken out of the solution and inspected. It was found that a group of monocrystals with (111) planes was formed on the thermally oxidized film, and grain boundaries were formed between the individual monocrystals. The average grain size was 560 μm and the thickness of the group of monocrystals was about 2 μm.

A resist pattern was formed on the group of monocrystals and a 3 μm-wide wiring of the group of gold monocrystals was formed in a spiral pattern by ion etching with an Ar gas. The thin film wiring of the group of gold monocrystals had grain boundaries at a distance of 560 μm on average and an electrical resistance as sufficiently low as $2.3 \times 10^{-6}$ cm.Ω when measured.

EXAMPLE 5

Aqua regia was prepared by mixing 30 ml of hydrochloric acid and 10 ml of nitric acid, and 2 g of gold was put therein and dissolved with stirring. 10 ml of the solution was sampled and placed into a reactor vessel and stirred while adding 100 ml of distilled water thereto. Then, an aqueous solution containing 10 g of sodium hydroxide (NaOH) was slowly added to the solution, and a Si substrate coated with a silicon nitride film was put into the resulting solution. The solution was left standing at 40° C. One hour thereafter, the substrate was taken out of the solution and inspected. It was found that a group of monocrystals with (111) planes was formed on the Si nitride film on the Si substrate and the average grain size of the individual monocrystals was about 220 μm.

EXAMPLE 6

40 g of potassium iodide and 6 g of iodine were put into 500 ml of distilled water and dissolved therein with stirring. Then, 3 g of gold was put into the solution and dissolved therein with stirring. After the solution, 100 ml of the solution was sampled and placed into a reactor vessel and stirred while adding 500 ml of distilled water. Then, the surface of a Ti substrate was brought in contact with the solution, while heating the solution to 80° C., and left standing as such. 30 minutes thereafter, the substrate was taken out of the solution and inspected. It was found that a group of monocrystals with (111) planes was formed on the Ti substrate and boundaries were formed between the individual monocrystals. The average grain size was 2 μm, and the thickness of the group of monocrystals was about 0.1 μm.

EXAMPLE 7

40 g of potassium iodide and 6 g of iodine were put into 500 ml of distilled water and dissolved therein with stirring. Then, 3 g of gold was put into the solution and dissolved therein with stirring. After the dissolution, 100 ml of the solution was sampled and placed into a reactor vessel and stirred while adding 500 ml of distilled water thereto to prepare a solution for crystal growth.

A 0.1 μm-thick Ti film was formed on a 0.5 μm-thick thermally oxidized film on a Si wafer by EB vapor deposition. A resist layer was formed on the Ti film and subjected to light exposure and development to conduct patterning. That is, the Ti film was patterned by reactive ion etching with a $CF_4$ gas, using the resist pattern as a mask, and then the resist layer was removed therefrom. The pattern was a matrix pattern consisting of 30×50 μm square at distances of 200 μm.

The surface of the substrate was brought in contact with the solution for crystal growth, and then the solution was heated to 80° C. and left standing as such. One hour thereafter, the substrate was taken out of the solution and inspected. It was found that a group of monocrystals with (111) planes was formed on the Ti surfaces, and grain boundaries were formed between the individual monocrystals. The average grain size of the monocrystals was about 2 μm and the thickness of the crystal film was about 100 nm. A result of STM revealed that the irregularity of the individual monocrystals surface was 5 Å in 1 μm square and no nucleation was observed on the $SiO_2$ film surface having a smaller nucleation density.

EXAMPLE 8

40 g of ammonium iodide and 10 g of iodine were put into 500 ml of distilled water and dissolved therein with stirring. Then, 3 g of gold was put into the solution and dissolved therein with stirring. After the dissolution, 100 ml of the solution was sampled and placed into a reactor vessel and stirred while adding 500 ml of distilled water thereto to prepare a solution for crystal growth. A resist layer was formed on a 0.3 μm-thick thermally oxidized film formed on a Si wafer and the wafer was subjected to light exposure and development to conduct patterning. That is, the thermally oxidized film was removed by RIE with a $CF_4$ gas, using the resist pattern as a mask to expose the Si surface, and then the resist layer was removed. The pattern was a matrix pattern consisting of 100×100 μm square at distances of 300 μm.

Then, the substrate was dipped in dilute hydrofluoric acid to remove the surface oxidized film from the Si surface, and then brought in contact with the solution for crystal growth. Then, the solution was heated to 80° C. and left standing as such. 1.5 hours thereafter, the substrate was taken out of the solution and inspected. It was found that a group of monocrystals with (111) plane was formed on Si and grain boundaries were formed between the individual monocrystals. The average grain size of the monocrystal was about 20 μm and the thickness of the crystal film was about 300 nm. A result of inspection by STM revealed that the vertical irregularity of the monocrystalline surface was 5 Å in 1 μm square. No nucleation was found on the $SiO_2$ surface having a smaller nucleation density.

EXAMPLE 9

40 g of potassium iodide and 6 g of iodine were put into 500 ml of distilled water and dissolved therein with stirring. Then, 3 g of gold was put into the solution and dissolved therein with stirring. After the dissolution, 100 ml of the solution was sampled and placed into a reactor vessel and stirred while adding 500 ml of distilled water thereto to prepare a solution for crystal growth.

A 0.1 $\mu$m-thick poly Si (p-Si) film was formed by LP CVD on a 0.5 $\mu$m-thick thermally oxidized film formed on a Si wafer. A resist layer was formed on the p-Si film, and the substrate was subjected to light exposure and development to conduct patterning. That is, the p-Si film was patterned by RIE with a $SF_6$ gas, using the resist pattern as a mask, and then the resist layer was removed. The pattern was a matrix pattern consisting of $100 \times 100$ $\mu$m square at distances of 400 $\mu$m.

The substrate was dipped in dilute hydrofluoric acid to remove a surface oxidized film from the p-Si surface, and then the substrate surface was brought in contact with the solution for crystal growth, while slowly adding 30 ml of an aqueous solution containing 100 mg of hydroquinone dissolved therein, and the solution was left standing as such. 3 hours thereafter the substrate was taken out of the solution and inspected. It was found that a group of monocrystals with (111) planes was formed on the p-Si film, and grain boundaries were formed between the individual monocrystals. The average grain size of monocrystals was about 15 $\mu$m, and the thickness of the crystal film was about 150 nm. A result of inspection by STM revealed that the irregularity of the individual monocrystalline surfaces was 5 Å in 1 $\mu$m square and no nucleation was observed on the $SiO_2$ film surface having a smaller nucleation density.

EXAMPLE 10

40 g of potassium iodide and 6 g of iodine were put into 500 ml of distilled water and dissolved therein with stirring. Then, 3 g of gold was put into the solution and dissolved therein with stirring. After the dissolution, 100 ml of the solution was taken out and placed into a reactor vessel and stirred while adding 500 ml of distilled water thereto to prepare a solution for crystal growth.

A 0.2 $\mu$m-thick Ti film was formed by EB vapor deposition on a 0.5 $\mu$m-thick thermally oxidized film formed on a Si wafer, and then a 0.3 $\mu$m-thick Si oxidized film was formed by ECR-CVD successively thereon. A resist layer was formed on the Si oxidized film and the substrate was subjected to light exposure and development to conduct patterning. That is, the Si oxidized film was removed by RIE with a $CF_4$ gas, using the resist pattern as a mask to expose the Ti surface, and then the resist layer was removed. The pattern was a matrix pattern consisting of $50 \times 50$ $\mu$m square at distances of 200 $\mu$m.

The thus prepared substrate surface was brought in contact with the solution for crystal growth, and then the solution was heated to 60° C. and left standing as such. One hour thereafter the substrate was taken out and inspected. It was found that a group of monocrystals with (111) planes was formed on the Ti surface and grain boundaries were formed between the individual monocrystals. The average grain size of the monocrystals was about 2 $\mu$m and the thickness of the crystal film was about 100 $\mu$m. A result of inspection by STM revealed that the irregularity of the individual monocrystalline surfaces was 5 Å in 1 $\mu$m square and no nucleation was observed on the Si oxidized film having a smaller nucleation density.

EXAMPLE 11

Aqua regia was prepared by mixing 60 ml of hydrochloric acid and 20 ml of nitric acid, and then 4 g of gold was put into the aqua regia and dissolved therein with stirring. After the dissolution, 30 ml of the solution was sampled and placed into a reactor vessel and stirred while adding 300 ml of distilled water thereto to prepare a solution for crystal growth.

A resist layer was formed on a 0.3 $\mu$m-thick silicon nitride film formed on the entire surface of a Si wafer, and the wafer was subjected to light exposure and development to conduct patterning. That is, the silicon nitride film removed by RIE with a $CF_4$ gas, using the resist pattern as a mask to expose the Si surface, and then the resist layer was removed. The pattern was a matrix pattern consisting of $50 \times 50$ $\mu$m square at distances of 200 $\mu$m.

The thus prepared substrate was dipped in dilute hydrofluoric acid to remove a surface oxidized film, and then brought in contact with the solution for crystal growth. Then, the solution was heated to 40° C., and an aqueous solution containing 30 g of potassium hydroxide dissolved therein was slowly added thereto, and then the solution was left standing as such. 1.5 hours thereafter the substrate was taken out and inspected. It was found that a group of monocrystals with (111) planes was formed on the Si surface and grain boundaries were formed between the individual monocrystals. The average grain size of monocrystals was about 6 $\mu$m and the thickness of the crystal film was about 200 $\mu$m. A result of inspection by STM revealed that the irregularity of the individual monocrystalline surfaces was 5 Å in 1 $\mu$m square. No nucleation was observed on the silicon nitride surface having a smaller nucleation density.

EXAMPLE 12

40 g of potassium iodide and 6 g of iodine were put in 500 ml of distilled water and dissolved therein with stirring. Then, 3 g of gold was put into the solution and dissolved therein with stirring. After the dissolution, 100 ml of the solution was sampled and placed into a reactor vessel and stirred while adding 500 ml of distilled water thereto to prepare a solution for crystal growth.

A 50 nm-thick Ti film was formed by EB vapor deposition on a 0.5 $\mu$m-thick thermally oxidized film formed on a Si wafer, and a resist layer was formed on the Ti film. The substrate was subjected to light exposure and development to conduct patterning. That is, the Ti film was patterned by RIE with a $CF_4$ gas, using the resist pattern as a mask, and then the resist layer was removed. The pattern was a matrix pattern consisting of $1 \times 1$ $\mu$m square at distances of 50 $\mu$m.

The thus prepared substrate surface was brought in contact with the solution for crystal growth, and then the solution was heated to 80° C. and left standing as such. 50 minutes thereafter, the substrate was taken out and inspected. It was found that a gold crystal thin film composed of monocrystals having grain sizes of about 50 $\mu$m and (111) planes having centers substantially on the Ti film was formed and grain boundaries were formed between the individual monocrystals. The thickness of the crystal film was about 200 nm, and a result of inspection by STM revealed that the irregularity of the individual monocrystalline surfaces was 5 Å in 1 μm square.

EXAMPLE 13

40 g of potassium iodide and 6 g of iodine were put into 500 ml of distilled water and dissolved therein with stirring. Then, 3 g of gold was put in the solution and dissolved therein with stirring. After the dissolution, 100 ml of the solution was sampled and placed into a reactor vessel and stirred, while adding 500 ml of distilled water thereto, to prepare a solution for crystal growth.

A 50 nm-thick poly Si (p-Si) film was formed by LP-CVD on a 0.5 μm-thick thermally oxidized film formed on a Si wafer, and a resist layer was formed on the p-Si film. The substrate was subjected to light exposure and development to conduct patterning. That is, the p-Si film was patterned by RIE with a $SF_6$ gas, using the resist pattern as a mask, and then the resist layer was removed. The pattern was a matrix pattern consisting of 5 μm in diameter, at distances of 5 μm.

The thus prepared substrate was dipped in dilute hydrofluoric acid to remove a surface oxidized film from the p-Si surface, and the substrate surface was brought in contact with the solution for crystal growth, and then 30 ml of an aqueous solution containing 100 mg of hydroquinone dissolved therein was slowly added thereto. The solution was left standing as such. 4 hours thereafter, the substrate was taken out and inspected. It was found that monocrystals having grain sizes of about 50 μm and (111) planes having centers substantially on the p-Si surface were formed and grain boundaries were formed between the individual monocrystals. The thickness of the crystal film was about 150 nm. A result of inspection by STM revealed that the irregularity of the individual monocrystalline surfaces was 5 Å in 1 μm square.

EXAMPLE 14

40 g of ammonium iodide and 10 g of iodine were put into 500 ml of distilled water and dissolved therein with stirring. Then, 3 g of gold was put into the solution and dissolved therein with stirring. After the dissolution, 100 ml of the solution was sampled and placed in a reactor vessel and stirred, while adding 500 ml of distilled water thereto, to prepare a solution for crystal growth. A resist layer was formed on a 0.3 μm-thick thermally oxidized film formed on a Si wafer and the wafer was subjected to light exposure and development to conduct patterning. That is, the thermally oxidized film was patterned by RIE with a $CF_4$ gas, using the resist pattern as a mask to expose the Si surface, and then the resist layer was removed. The pattern was a matrix pattern, 5 μm in diameter, at distances of 100 μm.

The thus prepared substrate was dipped in dilute hydrofluoric acid to remove a surface oxidized film from the Si surface and then the substrate surface was brought in contact with the solution for crystal growth. The solution was heated to 80° C. and then left standing as such. One hour thereafter, the substrate was taken out and inspected. It was found that the circular recesses on the Si surface were filled up with monocrystals with (111) planes.

With continued growth, the individual gold monocrystals themselves contacted one another to form grain boundaries at approximately middle positions between the individual Si surfaces. The thickness of the crystal film was about 0.4 μm.

EXAMPLE 15

40 g of potassium iodide and 6 g of iodine were put into 500 ml of distilled water and dissolved therein with stirring. Then, 3 g of gold was put into the solution and dissolved therein with stirring. After the dissolution, 100 ml of the solution was sampled and placed into a reactor vessel and stirred while adding 500 ml of distilled water thereto to prepare a solution for crystal growth.

A 0.2 μm-thick Ti film was formed by EB vapor deposition on a 0.5 μm-thick thermally oxidized film formed on a Si wafer, and then a 0.3 μm-thick Si oxidized film was formed successively by ECR-CVD on the Ti film. Then, a resist layer was formed on the Si oxidized film, and the substrate was subjected to light exposure and development to conduct patterning. That is, the Si oxidized film was patterned by RIE with a $CF_4$ gas, using the resist pattern as a mask to expose the Ti surface, and the resist layer was removed. The pattern was a matrix pattern, 1 μm in diameter, at distances of 50 μm.

The thus prepared substrate surface was brought in contact with the solution for crystal growth, and then the solution was heated to 60° C. and left standing as such. One hour thereafter, the substrate was taken out and inspected. It was found that the circular recesses on the Ti surface were filled up with monocrystals with (111) planes. The thickness of the crystal film was about 100 nm and no nucleation was observed on the Si oxidized film surface.

EXAMPLE 16

40 g of potassium iodide and 6 g of iodine were put into 500 ml of distilled water and dissolved therein with stirring. Then, 3 g of gold was put into the solution and dissolved therein with stirring. 100 ml of the solution was sampled and put into a reactor vessel and stirred, while adding 500 ml of distilled water thereto, to prepare a solution for crystal growth.

Then, the solution was heated to 80° C. on a hot plate, and when the color of the solution was changed from brown to light yellow, the substrate was brought in contact with the solution. The substrate used was a silicon wafer coated with a 5,000 Å-thick thermally oxidized and having spots of gold element, 0.5 μm in diameter, in a matrix pattern at distances of 30 μm, formed in the silicon wafer by ion implantation under such conditions as an ion current of 30 pA and an ion implantation density of $5 \times 10^{15}$ ions/cm$^2$ in a FIB apparatus (JIBL-100A, trademark of an apparatus by JEOL). One hour thereafter, the substrate was taken out and inspected. It was found that a group of gold monocrystals each having a grain size of about 30 μm and (111) planes having centers substantially at the Au-implantation sites was formed and grain boundaries were formed between the individual monocrystals. The thickness of the crystal film was about 200 nm. A result of inspection by STM revealed that the irregularity of the individual monocrystalline surfaces was 5 Å in 1 μm square.

EXAMPLE 17

40 g of potassium iodide and 6 g of iodine were put into 500 ml of distilled water and dissolved therein with stirring. Then, 3 g of gold was put into the solution and dissolved therein with stirring. After the solution, 100 ml of the solution was sampled and put into a reactor vessel, and stirred, while adding 500 ml of distilled water thereto, to prepare a solution for crystal growth.

Then, the solution was heated to 80° C. on a hot plate, and when the color of the solution was changed from brown to light yellow, the solution was brought in contact with the solution. The substrate used was a Si wafer with spots of Au element, about 20 nm in diameter and 8 nm thick in a matrix pattern at distances of 5 $\mu$m formed thereon by a scanning tunnel microscope (STM). Formation of Au pattern by STM was carried out under such conditions as a pulse application voltage of 3.5 V and a pulse time of 1 $\mu$sec after the Si wafer having a sufficient electroconductivity was dipped in dilute hydrofluoric acid to remove a surface oxidized film therefrom. Then, the thus prepared substrate was left standing in the atmospheric air for 3 days to form a surface oxidized film on the Si surface to provide a substrate for crystal growth.

One hour thereafter, the substrate was taken out and inspected. It was found that a group of gold monocrystals each having a grain size of about 5 $\mu$m and (111) planes having centers substantially at the Au implantation sites was formed, and grain boundaries were formed between the individual monocrystals. The thickness of the crystal film was about 100 nm. A result of inspection by STM revealed that the irregularity of the individual monocrystal surfaces was 5 Å in 1 $\mu$m square.

EXAMPLE 18

Aqua regia was prepared by mixing 60 ml of hydrochloric acid and 20 ml of nitric acid, and then 4 g of gold was put into the solution and dissolved therein with stirring. After the dissolution, 30 ml of the solution was sampled and put into a reactor vessel and stirred, while adding 300 ml of distilled water thereto, to prepare a solution for crystal growth.

A resist layer was formed on a 0.5 $\mu$m-thick silicon nitride film formed on a Si wafer and the substrate was subjected to light exposure and development. That is, the silicon nitride film was etched by RIE with a CF$_4$ gas, using the resist pattern as a mask to expose the Si surface, and then the resist layer was removed. The pattern was a matrix pattern consisting of 3 $\mu$m circles in diameter at distances of 100 $\mu$m.

Then, the substrate was brought in contact with the solution for crystal growth, and then an aqueous solution containing 30 g of sodium hydroxide (NaOH) was slowly added thereto. The solution was left standing at 40° C. One hour thereafter, the substrate was taken out and inspected. It was found that the circular recesses on the Si surface were filled up with monocrystals with (111) planes. No nucleation was found on the silicon nitride surface having a smaller nucleation density.

EXAMPLE 19

40 g of potassium iodide and 6 g of iodine were put into 500 ml of distilled water and dissolved therein with stirring. Then, 2.5 g of gold was put into the solution and dissolved therein with stirring. After the dissolution, 100 ml of the solution was sampled and put into a reactor vessel, and stirred while adding 500 ml of distilled water and 0.5 ml of hydrofluoric acid thereto. The surface of a Si wafer substrate with a 1 $\mu$m-thick thermally oxidized film formed on the surface was brought in contact with the solution, and then the solution was heated to 80° C. and left standing. 2 hours thereafter, the substrate was taken out and inspected. It was found that a group of gold monocrystals was formed on the thermally oxidized film and grain boundaries were formed between the individual monocrystals. The average grain size was 1.51 mm and the thickness of the crystal film was about 20 $\mu$m. As a result of electron beam channelling contrast, electron beam channelling pattern and X-ray diffraction analysis, it was found that the group of monocrystals had (111) planes and the individual monocrystals were free from defects. As a result of inspection of the crystal surfaces by a scanning tunnel microscope (STM), it was found that the irregularity of the individual monocrystal surfaces was 5 Å in 5 $\mu$m square.

EXAMPLE 20

4 g of potassium iodide and 6 g of iodine were put into 500 ml of distilled water and dissolved therein with stirring, and then 3 g of gold was put into the solution and dissolved therein with stirring. After the dissolution, 100 ml of the solution was sampled and put into a reactor vessel and stirred while adding 500 ml of distilled water and 0.3 ml of hydrofluoric acid thereto. Then the surface of a Si wafer with a 1 $\mu$m-thick thermally oxidized film formed on the surface was brought in contact with the solution, and 50 ml of an aqueous solution containing 100 mg of hydroquinone dissolved therein was slowly added thereto and then the solution was left standing at room temperature. 3 hours thereafter, the substrate was taken out and inspected. It was found that a thin film composed of a group of gold monocrystals each having an average grain size of 650 $\mu$m and having a film thickness of about 6 $\mu$m was formed on the thermally oxidized film. As a result of electron beam channelling contrast, electron beam channelling pattern and X-ray diffraction analysis, it was found that the group of monocrystals had (111) planes and the individual monocrystals were substantially free of defects. As a result of inspection of the crystal surfaces by STM, it was found that the irregularity of the individual monocrystal surfaces was 5 Å in 5 $\mu$m square.

EXAMPLE 21

40 g of potassium iodide and 6 g of iodine were put into 500 ml of distilled water and dissolved therein with stirring. Then, 2.5 g of gold was put into the solution and dissolved therein with stirring. After the dissolution, 100 ml of the solution was sampled and placed into a reactor vessel, and stirred while adding 500 ml of distilled water and 1 ml of hydrofluoric acid thereto. The surface of a Si wafer substrate with a 0.5 $\mu$m-thick silicon nitride film formed on the surface was brought in contact with the solution, and then the solution was heated to 70° C. and left standing. 2 hours thereafter, the substrate was taken out and inspected. It was found that a group of gold monocrystals was formed on the silicon nitride film and boundaries were formed between the individual monocrystals, the average grain size was 800 $\mu$m and the thickness of the crystal film was about 10 $\mu$m. As a result of electron beam channelling contrast, electron beam channelling pattern and X-ray diffraction analysis, it was found that the group of monocrystals had (111) planes and the individual monocrystals were substantially free of defects. As a result of inspection of the crystal surfaces by STM, it was found that the irregularity of the individual monocrystal surfaces was 5 Å in 5 μm square.

Then, a resist pattern was formed on the group of monocrystals and a 3 μm-wide wiring composed of the group of gold monocrystals was formed in a spiral shape by ion etching with an Ar gas. As a result of measurement of the electrical resistance of the wiring of gold crystals it was found as sufficiently low as $2.3 \times 10^{-6}$ cm.Ω.

EXAMPLE 22

40 g of potassium iodide and 6 g of iodine were put into 500 ml of distilled water and dissolved therein with stirring. Then, 3 g of gold was put into the solution and dissolved therein with stirring. After the dissolution, 100 ml of the solution was sampled and placed into a reactor vessel and stirred, while adding 500 ml of distilled water and 0.5 ml of hydrofluoric acid (46%) thereto, to prepare a solution for crystal growth.

A Si wafer was subjected to a thermal oxidation treatment to form a thermally oxidized film of $SiO_2$ on the surface. Then, a 0.1 μm-thick polySi (p-Si) film was formed by LP-CVD on the entire surface of the thermally oxidized film. A resist layer was then formed on the p-Si film and the substrate was subjected to light exposure and development to conduct patterning. That is, the p-Si film was patterned by reactive ion etching (RIE) with a $SF_6$ gas, using the resist pattern as a mask, and then the resist layer was removed. The pattern was a matrix pattern consisting of 50 μm circles in diameter at distances of 1.5 mm.

The surface of the thus prepared substrate was brought in contact with the solution for crystal growth, and then the solution was heated to 60° C. and left standing. One hour thereafter, the substrate was taken out and inspected. It was found that a group of monocrystals was formed on the p-Si surface and grain boundaries were formed between the individual monocrystals, and the average grain size of the monocrystals was about 25 μm and the thickness of the crystal film was about 100 nm. As a result of electron beam channelling contrast, electron beam channelling pattern and X-ray diffraction analysis, it was found that the group of monocrystals had (111) planes and the individual monocrystals were substantially free of defects. As a result of inspection of the crystal surfaces by STM, it was found that the irregularity of the individual monocrystal surfaces was 5 Å in 5 μm square. No nucleation was found on the $SiO_2$ surface having a smaller nucleation density.

EXAMPLE 23

40 g of potassium iodide and 6 g of iodine were put into 500 ml of distilled water and dissolved therein with stirring. Then, 3 g of gold was put into the solution and dissolved therein with stirring. After the dissolution, 100 ml of the solution was sampled and placed into a reactor vessel and stirred, while adding 500 ml of distilled water and 0.5 ml of hydrofluoric acid (46%) thereto, to prepare a solution for crystal growth.

A resist layer was formed on a 1 μm-thick thermally oxidized film formed on a Si wafer, and the wafer was subjected to light exposure and development to conduct patterning. That is, the thermally oxidized film was patterned with RIE with a $CF_4$ gas, using the resist pattern as a mask, and then the resist layer was removed. The pattern was a matrix pattern of 100 μm square at distances of 1.2 mm.

The surface of the thus prepared substrate was brought into contact with the solution for crystal growth, and 30 ml of an aqueous solution containing 100 mg of hydroquinone dissolved therein was slowly added thereto, and the solution was left standing. 3 hours thereafter, the substrate was taken out and inspected. It was found that a group of monocrystals was formed in the recesses on the Si surface and grain boundaries were formed between the individual monocrystals, and the average grain size of the monocrystals was about 15 μm and the thickness of the crystal film was about 300 nm. As a result of electron beam channelling contrast, electron beam channelling pattern and X-ray diffraction analysis, it was found that the group of monocrystals had (111) planes and the monocrystals were substantially free from defects. As a result of inspection of the crystal surfaces by STM, it was found that the irregularity of the individual monocrystal surfaces was 5 Å in 5 μm square and no nucleation was observed on the $SiO_2$ surface having a smaller nucleation density.

EXAMPLE 24

40 g of potassium iodide and 6 g of iodine were put in 500 ml of distilled water and dissolved therein with stirring. Then, 3 g of gold was put into the solution and dissolved therein with stirring. After the dissolution, 100 ml of the solution was sampled and placed in a reactor vessel and stirred, while adding 500 ml of distilled water and 0.5 ml of hydrofluoric acid (46%) thereto, to prepare a solution for crystal growth.

A 1 μm-thick silicon nitride film was formed by LP-CVD on a Si wafer, and a resist layer was formed on the silicon nitride film. Then, the substrate was subjected light exposure and development to conduct patterning. That is, the silicon nitride film was patterned by RIE with a $SF_6$ gas, using the resist pattern as a mask to expose the Si surface and then the resist layer was removed. The pattern was a matrix pattern consisting of 100 μm circles in diameter at distances of 1.7 mm.

The surface of the thus prepared substrate was brought into the solution for crystal growth, and then the solution was heated to 80° C. and left standing. 2 hours thereafter, the substrate was taken out and inspected, and it was found that a group of monocrystals was formed on the Si surface and grain boundaries were formed between the monocrystals, the average grain size of the monocrystals was about 20 μm and the thickness of the crystal film was about 100 nm. As a result of electron beam channelling contrast, electron beam channelling pattern and X-ray diffraction analysis, it was found that the group of monocrystals had (111) plane and the monocrystals were substantially free of defects. As a result of inspection of the crystal surfaces by STM, it was found that the irregularity of the individual monocrystal surfaces was 5 Å in 5 μm square and no nucleation was observed on the silicon nitride surface having a smaller nucleation density.

EXAMPLE 25

40 g of potassium iodide and 6 g of iodine were put into 500 ml of distilled water and dissolved therein with stirring. Then, 2.4 g of gold was put into the solution and dissolved therein with stirring. After the dissolution, 100 ml of the solution was sampled and put into a reactor vessel and stirred, while adding 500 ml of distilled water and 0.3 ml of hydrofluoric acid (46%) thereto, to prepare a solution for crystal growth.

A wafer was subjected to a thermal oxidation treatment to form thermally oxidized film of $SiO_2$ on the surface. Then, a 1 μm-thick polySi (p-Si) film was formed by LP-CVD on the thermally oxidized film, and a resist layer was formed on the p-Si film. Then, the substrate was subjected to light exposure and development to form a resist pattern. That is, the p-Si film was patterned by RIE with a $SF_6$ gas, using the resist pattern as a mask, and then the resist layer was removed. The pattern was a matrix pattern consisting of 8 μm circles in diameter at distances of 1.0 mm.

The surface of the thus prepared substrate was brought in contact with the solution for crystal growth, and then the solution was heated to 80° C. and left standing. 2 hours thereafter, the substrate was taken out and inspected, and it was found that a gold crystal thin film composed of monocrystals having grain sizes of about 1 mm having centers substantially on the p-Si planes was formed and grain boundaries were formed between the individual monocrystals. The thickness of the crystal film was about 20 μm. As a result of electron beam channelling contrast, electron beam channelling pattern and X-ray diffraction analysis, it was found that the group of monocrystals had (111) planes and the individual monocrystal surfaces were substantially free of defects. As a result of inspection of crystal surfaces by STM, it was found that the irregularity of the individual monocrystal surfaces was 5 Å in 5 μm square and no nucleation was observed on the $SiO_2$ surface having a smaller nucleation density.

EXAMPLE 26

50 g of potassium iodide and 7 g of iodine were put into distilled water and dissolved therein with stirring. Then, 3 g of gold was put into the solution and dissolved therein with stirring. After the dissolution, 100 ml of the solution was sampled and placed into a reactor vessel and stirred, while adding 500 ml of distilled water and 0.4 ml of hydrofluoric acid (46%) thereto, to prepare a solution for crystal growth.

A resist layer was formed on a 50 nm-thick thermally oxidized film on a Si wafer, and then the substrate was subjected to light exposure and development to form a resist pattern. That is, the thermally oxidized film was patterned by RIE with a $SF_6$ gas, using the resist pattern as a mask, and then the resist layer was removed. The pattern was a matrix pattern consisting of 5 μm circles in diameter at distances of 0.5 mm on the Si surface.

The surface of the thus prepared substrate was brought in contact with the solution for crystal growth, and 30 ml of an aqueous solution containing 10 mg of sodium hydrosulfite dissolved therein was slowly added thereto, and the solution was left standing. 4 hours thereafter, the substrate was taken out and inspected, and it was found that a group of monocrystals having grain sizes of 0.5 mm having centers substantially on the Si surfaces was formed and grain boundaries were formed between the individual monocrystals and the thickness of the crystal film was about 10 μm. As a result of electron beam channelling contrast, electron beam channelling pattern and X-ray diffraction analysis, it was found that the group of monocrystals had (111) planes and the individual monocrystals were substantially free of defects. As a result of inspection of the crystal surfaces by STM, it was found that the irregularity of the individual monocrystal surfaces were 5 Å in 5 μm square and no nucleation was observed on the $SiO_2$ surface having a smaller nucleation density.

EXAMPLE 27

40 g of ammonium iodide and 10 g of iodine were put into 500 ml of distilled water and dissolved therein with stirring. Then, 3 g of gold was put into the solution and dissolved therein with stirring. After the dissolution, 100 ml of the solution was sampled and put into a reactor vessel and stirred, while adding 500 ml of distilled water and 0.5 ml of hydrofluoric acid (46%) thereto, to prepare a solution for crystal growth.

A 1 μm-thick silicon nitride film was formed by LP-CVD on the entire surface of a Si wafer, and a resist layer was formed on the silicon nitride film. Then, the substrate was subjected to light exposure and development to form a resist pattern. That is, the silicon nitride film was etched by RIE with a $SF_6$ gas to expose the Si surface, and then the resist layer was removed. The pattern was a matrix pattern consisting of 10 μm circles in diameter at distances of 1.5 mm.

The surface of the thus prepared substrate was brought in contact with the solution for crystal growth, and then the solution was heated to 80° C. and left standing. 30 minutes thereafter, the substrate was taken out and inspected, and it was found that the recesses on the Si surfaces were filled up with monocrystals having (111) planes. The thickness of the crystal film was about 1 μm and no nucleation was observed on the silicon nitride surface.

As a result of electron beam channelling contrast, electron beam channelling pattern and X-ray diffraction analysis, it was found that the group of monocrystals had (111) plane and the individual monocrystals were substantially free of defects. As a result of inspecting the crystal surfaces by STM, it was found that the irregularity of the individual monocrystal surfaces was 5 Å in 5 μm square.

TABLE 1

Dependency of Average Grain Size and Nucleation Density on Growth Conditions

| | | Surface material | | | | | |
|---|---|---|---|---|---|---|---|
| | | Insulator ($SiO_2$) | | Semi-conductor (Si) | | Electroconductor (Ti) | |
| Growth conditions | | Average grain size (μm) | Nucleation density (grains/mm$^2$) | Average grain size (μm) | Nucleation density (grains/mm$^2$) | Average grain size (μm) | Nucleation density (grains/mm$^2$) |
| Gold complex $[AuI_4]^-$ | 80° C. evaporation treatment | 560 | 3.1 | 20 | 2,500 | 2 | 250,000 |
| | 70° C. evaporation treatment | 520 | 3.7 | 20 | 2,500 | 1.2 | 700,000 |
| | 60° C. evaporation treatment | 400 | 6.3 | 25 | 1,600 | 3 | 110,000 |
| | 50° C., hydroquinone added | 280 | 12.8 | 10 | 1,000 | 1.2 | 700,000 |
| | 20° C., hydroquinone added | 310 | 10.4 | 15 | 4,400 | 1.0 | 1,000,000 |

TABLE 1-continued

Dependency of Average Grain Size and Nucleation Density on Growth Conditions

| | | Surface material | | | | | |
|---|---|---|---|---|---|---|---|
| | | Insulator (SiO$_2$) | | Semi-conductor (Si) | | Electroconductor (Ti) | |
| Growth conditions | | Average grain size ($\mu$m) | Nucleation density (grains/mm$^2$) | Average grain size ($\mu$m) | Nucleation density (grains/mm$^2$) | Average grain size ($\mu$m) | Nucleation density (grains/mm$^2$) |
| Gold complex [AuCl$_4$]$^-$ | 20° C., sodium sulfite added | 220 | 20.7 | 22 | 2,100 | 1.1 | 830,000 |
| | 60° C., aqueous NaOH solution added | 180 | 30.9 | 3 | 110,000 | — | — |
| | 40° C., aqueous NaOH solution added | 220 | 20.7 | 6 | 28,000 | — | — |
| | 20° C., aqueous NaOH solution added | 200 | 25.0 | 4 | 62,000 | — | — |

TABLE 2

Dependency of Average Grain Size and Nucleation Density on Growth Conditions

| | | Hydrofluoric acid added | | Hydrofluoric acid not added | |
|---|---|---|---|---|---|
| Growth conditions (Substrate: Si thermally oxidized film) | | Average grain size ($\mu$m) | Nucleation density (grains/mm$^2$) | Average grain size ($\mu$m) | Nucleation density (grains/mm$^2$) |
| Gold complex [AuI$_4$]$^-$ | 80° C., Evaporation treatment | 1560 | 0.41 | 560 | 3.1 |
| | 70° C., Evaporation treatment | 1410 | 0.50 | 520 | 3.7 |
| | 60° C., Evaporation treatment | 1320 | 0.57 | 400 | 6.3 |
| | 50° C., Hydroquinone added | 580 | 3.0 | 280 | 12.8 |
| | 20° C., Hydroquinone added | 650 | 2.4 | 310 | 10.4 |
| | 20° C., Sodium sulfite added | 420 | 5.7 | 220 | 20.7 |

What is claimed is:

1. A process for forming a gold thin film, which comprises subjecting a gold complex selected from the group consisting of [AuI$_4$]$^-$ and [AuCl$_4$]$^-$ to a decomposition treatment to transfer the gold in a solution to a supersaturated state, and forming a crystalline gold thin film composed of a group of monocrystals each having a grain size of at least 1 $\mu$m on the surface of a substrate.

2. A process according to claim 1, wherein the crystalline gold thin film is composed of a group of monocrystals with high (111) orientation.

3. A process according to claim 1, wherein the decomposition treatment is carried out by evaporation of a component constituting the gold complex from the solution.

4. A process according to claim 1, wherein the decomposition treatment is carried out by addition of a reducing agent to the solution.

5. A process according to claim 1, wherein the surface of the substrate is composed of an insulator material.

6. A process according to claim 1, wherein the surface of the substrate is composed of a semiconductor material.

7. A process according to claim 1, wherein the surface of the substrate is composed of an electroconductive material.

8. A process for selectively forming a gold thin film, which comprises subjecting a gold complex selected from the group consisting of [AuI$_4$]$^-$ and [AuCl$_4$]$^-$ in a gold complex solution to a decomposition treatment to transfer the gold in the solution to a supersaturated state, and forming a crystalline gold thin film composed of a group of monocrystals each having a grain size of at least 1 $\mu$m only on a first surface composed of a material having a larger nucleation density of a substrate having the first surface and a second surface composed of a material having a smaller nucleation density, the first surface and the second surface being provided adjacent to one another.

9. A process according to claim 8, wherein the crystalline gold thin film is composed of a group of monocrystals with high (111) orientation.

10. A process according to claim 8, wherein the decomposition treatment is carried out by evaporation of a substance constituting the gold complex from the solution.

11. A process according to claim 8, wherein the decomposition treatment is carried out by adding a reducing agent to the solution containing a substance constituting the gold complex.

12. A process according to claim 8, wherein the material having a larger nucleation density is a semiconductor material.

13. A process according to claim 8, wherein the material having a larger nucleation density is an electroconductive material.

14. A process according to claim 8, wherein the material having a smaller nucleation density is an insulator material.

15. A process for forming a crystalline gold crystal having a grain size of at least 1 $\mu$m, which comprises subjecting a gold complex selected from the group consisting of [AuI$_4$]$^-$ and [AuCl$_4$]$^-$ in a gold complex solution to a decomposition treatment to transfer the gold in the solution to a supersaturated state, and making the monocrystal grow only from a single nucleus on a first surface composed of a material having a larger nucleation density and having a sufficiently small area so as to form only said single nucleus of a substrate having the first surface and a second surface composed of a material having a smaller nucleation density, the first surface and the second surface being provided adjacent to one another.

16. A process according to claim 15, wherein the monocrystal is a monocrystal with high (111) orientation 17. A process according to claim 15, wherein the decomposition treatment is carried out by evaporation of a substance constituting the gold complex from the solution.

18. A process according to claim 15, wherein the decomposition is carried out by adding a reducing agent to the solution containing a substance constituting the gold complex.

19. A process according to claim 15, wherein the material having a larger nucleation density is a semiconductor material.

20. A process according to claim 15, wherein the material having a larger nucleation density is an electro-conductive material.

21. A process according to claim 15, wherein the material having a smaller nucleation density is an insulator material.

22. A process for forming a gold thin film, which comprises subjecting a gold complex to a decomposition treatment in the presence of an etching species acting on a substrate material to transfer gold in a solution to a supersaturated state, and forming a crystalline gold thin film composed of a group of monocrystals on the surface of the substrate.

23. A process according to claim 22, wherein the group of monocrystals is composed of monocrystals having grain sizes of 3 μm or more.

24. A process according to claim 22, wherein the crystalline gold thin film is composed of a group of monocrystals with the (111) orientation.

25. A process according to claim 22, wherein the etching species is hydrofluoric acid.

26. A process according to claim 22, wherein the gold complex are $[AuI_4]^-$.

27. A process according to claim 22, wherein the decomposition treatment is carried out by evaporation of a component constituting the gold complex from the solution.

28. A process according to claim 22, wherein the decomposition treatment is carried out by adding a reducing agent to the solution.

29. A process according to claim 22, wherein the surface of the substrate is composed of an insulator material.

30. A process according to claim 22, wherein the surface of the substrate is composed of a semiconductor material.

31. A process according to claim 22, wherein the surface of the substrate is composed of a silicon compound.

32. A process for selectively forming a gold thin film, which comprises a step of providing a substrate having a first surface composed of a material having a larger nucleation density and a second surface composed of a material having a smaller nucleation density, the first surface and the second surface being adjacent to each other, and a step of subjecting a gold complex in a gold complex solution to a decomposition treatment in the presence of an etching species acting on the material having a smaller nucleation density to transfer the gold in the solution to a supersaturated state and forming a crystalline gold thin film composed of a group of monocrystals only on the surface having a greater nucleation density.

33. A process according to claim 32, wherein the group of monocrystals is composed of monocrystals having grain sizes of 3 μm or more.

34. A process according to claim 32, wherein the crystalline gold thin film is composed of a group of monocrystals with the (111) orientation.

35. A process according to claim 32, wherein the etching species is hydrofluoric acid.

36. A process according to claim 32, wherein the gold complex is $[AuI_4]^-$.

37. A process according to claim 32, wherein the decomposition treatment is carried out by evaporation of a substance constituting the gold complex from the solution.

38. A process according to claim 32, wherein the decomposition treatment is carried out by adding a reducing agent to the solution containing a substance constituting the gold complex.

39. A process according to claim 32, wherein the material having a larger nucleation density is a semiconductor material.

40. A process according to claim 32, wherein the material having a larger nucleation density is an electro-conductive material.

41. A process according to claim 32, wherein the material having a smaller nucleation density is an insulator material.

42. A process according to claim 32, wherein the material having a smaller nucleation density is a silicon compound.

43. A process for forming a gold monocrystal, which comprises a step of providing a substrate having a first surface composed of a material having a larger nucleation density and having a sufficiently small area so as to form only a single nucleus and a second surface composed of a material having a smaller nucleation density, the first surface and the second surface being adjacent to each other, and a step of subjecting a gold complex in a gold complex solution to a decomposition treatment in the presence of an etching species acting on the material having a smaller nucleation density to transfer the gold in the solution to a supersaturated state, and making the monocrystal grow from the single nucleus on the first surface having a larger nucleation density.

44. A process according to claim 43, wherein the monocrystal is a monocrystal with the (111) orientation.

45. A process according to claim 43, wherein the gold complex is $[AuI_4]^-$.

46. A process according to claim 43, wherein the etching species is hydrofluoric acid.

47. A process according to claim 43, wherein the decomposition treatment is carried out by evaporation of a substance constituting the gold complex from the solution.

48. A process according to claim 43, wherein the decomposition treatment is carried out by adding a reducing agent to the solution containing a substance constituting the gold complex.

49. A process according to claim 43, wherein the material having a larger nucleation density is a semiconductor material.

50. A process according to claim 43, wherein the material having a larger nucleation density is an electro-conductive material.

51. A process according to claim 43, wherein the material having a smaller nucleation density is an insulator material.

52. A process according to claim 43, wherein the material having a smaller nucleation density is a silicon compound.

* * * * *

UNITED STATES PATENT AND TRADEMARK OFFICE
CERTIFICATE OF CORRECTION

PATENT NO. : 5,320,703

DATED : June 14, 1994

INVENTOR(S) : TSUTOMU IKEDA, ET AL.

It is certified that error appears in the above-identified patent and that said Letters Patent is hereby corrected as shown below:

ON TITLE PAGE

Item [56] References Cited, under FOREIGN PATENT DOCUMENTS: "5554509" should read --55-54509--.

COLUMN 6

Line 51, "this" should read --This--.

COLUMN 20

Line 24, "adding" should be deleted.

COLUMN 21

Line 35, "$2.3 \times 10^{-6}$cm.$\Omega$" should read --$2.3 \times 10^{-6} \Omega \cdot$cm--.

COLUMN 23

Line 57, "square" should read --squares--.

COLUMN 24

Line 21, "square" should read --squares--.
Line 59, "square" should read --squares--.

COLUMN 27

Line 46, "3 µm circles" should read --circles 3 µm--.

UNITED STATES PATENT AND TRADEMARK OFFICE
CERTIFICATE OF CORRECTION

PATENT NO. : 5,320,703

DATED : June 14, 1994

INVENTOR(S) : TSUTOMU IKEDA, ET AL.

It is certified that error appears in the above-identified patent and that said Letters Patent is hereby corrected as shown below:

COLUMN 29

Line 9, "$2.3 \times 10^{-6}$cm.$\Omega$" should read --$2.3 \times 10^{-6} \Omega \cdot$cm--.
Line 30, "50 µm circles in diameter" should read --circles 50 µm in diameter--.
Line 68, "square" should read --squares--.

COLUMN 30

Line 35, "light" should read --to light--.
Line 40, "100 µm circles in diameter" should read --circles 100 µm in diameter--.

COLUMN 31

Line 47, "5 µm circles" should read --circles 5 µm--.

COLUMN 32

Line 34, "10 µm circles" should read --circles 10 µm--.

UNITED STATES PATENT AND TRADEMARK OFFICE
CERTIFICATE OF CORRECTION

PATENT NO. : 5,320,703
DATED : June 14, 1994
INVENTOR(S) : TSUTOMU IKEDA, ET AL.

It is certified that error appears in the above-identified patent and that said Letters Patent is hereby corrected as shown below:

COLUMN 35

Line 39, "are" should read --is--.

Signed and Sealed this

Twenty-seventh Day of December, 1994

Attest:

BRUCE LEHMAN

Attesting Officer        Commissioner of Patents and Trademarks